United States Patent
Yang et al.

(10) Patent No.: US 10,483,200 B1
(45) Date of Patent: Nov. 19, 2019

(54) INTEGRATED CIRCUITS (ICS) EMPLOYING ADDITIONAL OUTPUT VERTICAL INTERCONNECT ACCESS(ES) (VIA(S)) COUPLED TO A CIRCUIT OUTPUT VIA TO DECREASE CIRCUIT OUTPUT RESISTANCE

(71) Applicant: QUALCOMM Incorporated, San Diego, CA (US)

(72) Inventors: Haining Yang, San Diego, CA (US); Xiangdong Chen, San Diego, CA (US); John Jianhong Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/143,647

(22) Filed: Sep. 27, 2018

(51) Int. Cl.
*H01L 21/00* (2006.01)
*H01L 23/522* (2006.01)
(Continued)

(52) U.S. Cl.
CPC .... *H01L 23/5228* (2013.01); *H01L 21/76224* (2013.01); *H01L 21/76816* (2013.01); *H01L 21/76895* (2013.01); *H01L 21/823821* (2013.01); *H01L 21/823871* (2013.01); *H01L 21/823878* (2013.01); *H01L 23/528* (2013.01); *H01L 23/5226* (2013.01); *H01L 23/5283* (2013.01); *H01L 23/535* (2013.01); *H01L 27/092* (2013.01); *H01L 27/0924* (2013.01); *H01L 29/785* (2013.01);
(Continued)

(58) Field of Classification Search
CPC ............. H01L 29/66545; H01L 29/785; H01L 29/66871
See application file for complete search history.

(56) References Cited

U.S. PATENT DOCUMENTS 8,881,083 B1 11/2014 Deng et al.
8,941,243 B2 1/2015 Shim
(Continued)

OTHER PUBLICATIONS

Yang, Sam et al., "10nm High Performance Mobile SoC Design and Technology Co-Developed for Performance, Power, and Area Scaling," 2017 Symposium on VLSI Technology Digest of Technical Papers, 2018, pp. T70-T71.

*Primary Examiner* — Nicholas J Tobergte
(74) *Attorney, Agent, or Firm* — W&T/Qualcomm

(57) ABSTRACT

Integrated circuits (ICs) employing additional output vertical interconnect access(es) (via(s)) coupled to a circuit output via to decrease circuit output resistance and related methods are disclosed. In exemplary aspects, an output metal interconnect is formed in the IC that extends between a first output contact connected to an output transistor(s) of a circuit, and across an adjacent dummy gate to a second output contact area on the opposite side of the dummy gate from the signal output node. A second output via is connected to the output metal interconnect in the second output contact area. A metal line in a metal layer above the diffusion area and metal contacts is connected to the output via and second output via having parallel output via resistances to reduce the output via resistance of the output transistor(s) of the circuit, and thus reduces the overall resistance of the signal output node of the circuit.

24 Claims, 21 Drawing Sheets

(51) Int. Cl.
  *H01L 29/78* (2006.01)
  *H01L 27/092* (2006.01)
  *H01L 21/8238* (2006.01)
  *H01L 21/762* (2006.01)
  *H01L 21/768* (2006.01)
  *H01L 23/528* (2006.01)
  *H01L 23/535* (2006.01)
  *H01L 29/423* (2006.01)
  *H01L 29/06* (2006.01)
  *H01L 29/417* (2006.01)
  *H01L 29/66* (2006.01)
  *H01L 29/10* (2006.01)

(52) U.S. Cl.
  CPC .. *H01L 21/823807* (2013.01); *H01L 29/0665* (2013.01); *H01L 29/0673* (2013.01); *H01L 29/1037* (2013.01); *H01L 29/41791* (2013.01); *H01L 29/42392* (2013.01); *H01L 29/66795* (2013.01)

(56) References Cited

U.S. PATENT DOCUMENTS

| | | | |
|---|---|---|---|
| 9,734,276 B2 | 8/2017 | Kim et al. | |
| 9,831,271 B2 | 11/2017 | Tamaru | |
| 9,831,272 B2 * | 11/2017 | Chen | H01L 27/11807 |
| 9,865,704 B2 * | 1/2018 | Xie | H01L 21/76224 |
| 9,960,231 B2 | 5/2018 | Chen et al. | |
| 9,984,932 B1 * | 5/2018 | Zang | H01L 21/823431 |
| 10,062,768 B2 * | 8/2018 | Choi | H01L 29/66545 |
| 10,270,430 B2 * | 4/2019 | Guo | H03K 3/356121 |
| 10,373,942 B2 * | 8/2019 | Asra | |
| 2008/0054307 A1 | 3/2008 | Shimizu | |
| 2017/0154848 A1 | 6/2017 | Fan et al. | |
| 2018/0151496 A1 | 5/2018 | Biswas et al. | |

* cited by examiner

INTEGRATED CIRCUITS (ICS) EMPLOYING ADDITIONAL OUTPUT VERTICAL INTERCONNECT ACCESS(ES) (VIA(S)) COUPLED TO A CIRCUIT OUTPUT VIA TO DECREASE CIRCUIT OUTPUT RESISTANCE

BACKGROUND

I. Field of the Disclosure

The technology of the disclosure relates generally to semiconductor devices, and more specifically, to parasitic resistance of transistors realized in cell circuits fabricated according to circuit cell architectures, including standard cells.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

As electronic devices become more complex in functionality, so does the need to include a greater number of transistors in such devices. But as electronic devices are provided in increasingly smaller packages, such as in mobile devices for example, there is a need to provide a greater number of transistors in a smaller IC chip. This increase in the number of transistors is achieved in part through continued efforts to miniaturize transistors in ICs (i.e., placing increasingly more transistors into the same amount of space). For example, node sizes in ICs are being scaled down by a reduction in minimum metal line width in the ICs (e.g., 65 nanometers (nm), 45 nm, 28 nm, 20 nm, etc.). As a result, gate lengths are also scalably reduced, thereby reducing channel length of the transistors and interconnects. Reduced channel length in planar transistors has the benefit of increasing drive strength (i.e., increased drive current) and providing smaller parasitic capacitances resulting in reduced circuit delay. However, as channel length in planar transistors is reduced such that the channel length is of the same order of magnitude as depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths), and therefore, reduced gate control.

To overcome the SCEs due to the reduction in gate and channel lengths in planar transistors, "wrap around" or "gate around" transistors have been developed. A wrap around transistor includes a gate material wrapped around at least a portion of a channel structure to provide better gate control over an active channel therein. Better gate control provides reduced current leakage and increased threshold voltage as compared to a planar transistor of a similar footprint. An example of a wrap around transistor is a metal-oxide semiconductor (MOS) fin field-effect transistor (FET) (FinFET). A FinFET can provide a channel structure formed by thin silicon (Si) "fins," and a gate that wraps around portions of the fins. In this regard, FIG. 1 illustrates a conventional MOS FinFET 100 ("FinFET 100") as an example. The FinFET 100 includes a substrate 102 and a fin 104 made of a semiconductor material disposed above the substrate 102. An oxide layer 106 is included on either side of the fin 104. The FinFET 100 includes a "wrap-around" gate 108 disposed on the substrate 102 and over the fin 104. A source 110 and a drain 112 are formed in the fin 104 on opposing sides of the gate 108 to provide the source 110 and the drain 112 for the FinFET 100. Metal contacts (not shown) are disposed in contact with the source 110 and the drain 112 to provide respective source and drain contacts. The fin 104 serves as a conduction channel 114 between the source 110 and the drain 112. The wrap-around structure of the gate 108 provides better electrostatic control over the conduction channel 114, and thus helps reduce the leakage current and overcomes other SCEs.

Thus, FinFETs such as the FinFET 100 in FIG. 1 are capable of delivering high current through a small silicon footprint. Improved electrostatic control and a taller fin height enable high "ON" current for FinFETs. FIG. 2 is a diagram of an exemplary circuit 200 that can include FinFET devices, such as the FinFET 100 in FIG. 1. The circuit 200 includes two inverter gates 202(1), 202(2) connected in series with a transmission wire 204 coupling the output 206 of the inverter gate 202(1) to the input 208 of the inverter gate 202(2). The stage delay in the circuit 200 is modeled in the delay circuit 210 in FIG. 2. The inverter gate 202(1) has a transistor resistance $R_1$ and a parallel wire capacitance $C_W/2$. The transmission wire 204 has a series via resistance $R_{VIA}$ and a wire resistance $R_W$, and a parallel wire capacitance $C_W/2$. The inverter gate 202(2) has a gate input resistance $R(2)$ and a parallel gate capacitance $C_G$. These resistances and capacitances add stage delay to a signal propagating through the circuit 200, which is shown in equation 212 in FIG. 2.

One substantial factor that contributes to the resistance and delay of a FinFET, including any FinFETs included in the circuit 200 in FIG. 2 for example, is the contact resistance between the source and drain contacts and their respective source and drain in the FinFET. In this regard, FIG. 3A is a perspective view of an exemplary P-type semiconductor FinFET 300P and N-type semiconductor FinFET 300N to further illustrate source and drain contacts to provide interconnections between the sources and drains of the FinFETs 300P, 300N and metal lines in higher, interconnection layers. With reference to FIG. 3A, the FinFET 300P includes a substrate 302 and two channel structures 304A, 304B provided in the form of fins 306A, 306B in this example. The fins 306A, 306B are made of a semiconductor material and form a conduction channel 308. The fins 306A, 306B can be disposed above the substrate 302 or partially formed within the substrate 302. As shown in a front, left side 310 of the FinFET 300P in FIG. 3A, the FinFET 300P further includes source elements 312A, 312B above the fins 306A, 306B to form a source $S_1$. The source elements 312A, 312B are merged in contact with each together in this example. As also shown in FIG. 3A, the FinFET 300P further includes drain elements 318A, 318B above the fins 306A, 306B to form a drain $D_1$. The drain elements 318A, 318B are merged in contact with each together in this example. To provide a contact to the source $S_1$ and the drain $D_1$ of the FinFET 300P, a source contact 322 and a drain contact 324 are disposed in contact with respective source elements 312A, 312B and drain elements 318A, 318B to allow for interconnections to the source $S_1$ and drain $D_1$ in an interconnect layer 344. Metal contact lines 323, 325 are disposed in contact with the respective source contact 322 and a drain contact 324. A "wrap-around" gate $G_1$ is disposed around and adjacent to the fins 306A, 306B on the substrate 302. Dummy gates $DG_1$, $DG_2$ are also disposed around and adjacent to the fins 306A, 306B on opposite sides of the source and drain contacts 322, 324 from the gate $G_1$.

With continuing reference to FIG. 3A, metal layer 0 (M0) and metal layer 1 (M1) are shown as being included in the interconnect layer 344. The source and drain contacts 322, 324 are connected to the interconnect layer 344 through first vias $V0_1$, $V0_2$. The first vias $V0_1$, $V0_2$ are fabricated to align with the layout of the source and drain contacts 322, 324. The first vias $V0_1$, $V0_2$ connect the source and drain contacts 322, 324 through metal contact lines 323, 325 to respective metal lines $M0_1$, $M0_2$. Metal line $M0_1$ is a power rail that is interconnected to other devices, and thus metal line $M0_1$ is larger (e.g., 3× of metal line $M0_2$). Second vias $V1_1$, $V1_2$ connect the respective metal lines $M0_1$, $M0_2$ to metal lines $M1_1$, $M1_2$ to support providing connections to the source $S_1$ and the drain $D_1$ of the FinFET 300P. Thus, as shown for the example of the FinFET 300P in FIG. 3B, which is a side view of a portion of the FinFET 300P in FIG. 3A, the cross-sectional area of the source contact 322 and metal contact line 323 affect the source contact resistance of the FinFET 300P, and similarly the drain contact 324 resistance. Additionally, the source and drain contacts 322, 324 add to coupling capacitance between the gate $G_1$, the source $S_1$, and drain $D_1$ of the FinFET 300P, which can increase the Miller capacitance effect, thereby increasing the gate capacitance and reducing switching speed. The negative impact of source and drain contact 322, 324 resistance and capacitance is further increased in the FinFET 300P by its inclusion of multiple fins 306A, 300B to support higher currents and faster switching speeds, because the higher current flows through the same metal contact line 323 cross-sectional area. As the node size of the FinFET 300N, 300P is reduced (e.g., down to 10 nm, 7 nm, 5 nm and below), the pitch between the fins 306A, 306B is reduced, thus reducing the source $S_1$ and drain $D_1$ areas for contact, thus increasing contact resistance, and source $S_1$ and drain $D_1$ as a result. Alignment between the source and drain contacts 322, 324 and the source $S_1$ and drain $D_1$ areas may also be more difficult in fabrication processes, thus further increasing contact resistance, and source $S_1$ and drain $D_1$ as a result. The metal contact line 323 and via $V0_1$ are also reduced in size and pitch due to scaling down of the pitch of the fins 306A, 306B, thus increasing via resistance, which also increases the source $S_1$ and drain $D_1$ resistance in an undesired manner.

SUMMARY OF THE DISCLOSURE

Aspects disclosed herein include integrated circuits (ICs) employing additional vertical interconnect access(es) (via(s)) coupled to a circuit output via to decrease circuit output resistance. Related methods are also disclosed. For example, the IC may be realized in a cell circuit that is laid out according to a circuit cell architecture, such as a standard cell for complementary metal oxide semiconductor (CMOS) circuits. In exemplary aspects disclosed herein, an integrated circuit (IC) is provided that includes a diffusion region(s) formed in a substrate. Semiconductor structures of semiconducting material are formed in the substrate in the diffusion region(s) of the IC to form semiconductor channel structures. A source and drain can be formed on end portions of the semiconductor channel on adjacent sides of an active gate of a gate disposed above a semiconductor channel structure to form a Field-Effect Transistor (FET). Metal contacts are formed in contact with the gate, source, and drain of the FET to provide connectivity to the FET. Vias are formed in contact with the metal contacts to extend connectivity to the FET into upper metal interconnect layers. Multiple FETs can be formed and interconnected to each other to form a circuit as part of the IC, wherein the circuit is configured to generate an output signal on at least one of a source and drain of an output FET(s) as a signal output node as a function of an input signal. The output resistance of the signal output node of the circuit is a function of the resistance of the metal contact and an output via coupled to the signal output node. An increased output resistance increases current-resistance (IR) drop and output delay of the circuit. Thus, in exemplary aspects disclosed herein, to reduce the output resistance of signal output node of the circuit, an output metal interconnect is formed in the IC that extends between a first output contact connected to the output FET in a first output contact area, and across an adjacent dummy gate to a second output contact area on the opposite side of the dummy gate from the signal output node. At least one additional, second output via is connected to the output metal interconnect in the second output contact area. A metal line in a metal layer above the diffusion area and metal contacts is connected to the output via and second output via having parallel output via resistances which reduces the output via resistance of the output FET(s) of the circuit, and thus reduces the overall resistance of the signal output node of the circuit. In this manner, the current-resistance (IR) drop and the output delay as a result of the resistance of the signal output node of the FET may be reduced.

In one exemplary aspect, the second output contact area for connecting the second output via to the signal output node is on the opposite side of the dummy gate from the signal output node of the circuit in a diffusion break area above the diffusion break in the substrate. The diffusion break area is in an existing "white space" in the IC that may be filled with an interlayer dielectric (ILD) material and devoid of a semiconductor device structure. This "white space" allows the output metal interconnect that is coupled to the signal output node of the circuit to be extended into the diffusion break area as a second output contact area to support connectivity to a second output via electrically coupled to the signal output node without increasing the area of the IC. In another exemplary aspect, the second output contact area for connecting the second output via to the signal output node is formed by forming a second dummy gate in the IC, which may increase the area in the IC. The second dummy gate is adjacent to a first dummy gate which is adjacent to the signal output node of the circuit. The output metal interconnect extends between the first output contact connected to the output FET, and across the first dummy gate to a second output contact area between the first and second dummy gates. A second metal contact can be formed that extends between the diffusion area of the IC and a region of the output metal interconnect in the second output contact area between the first and second dummy gates.

In this regard, in one exemplary aspect, an IC is provided. The IC comprises a substrate. The IC also comprises a diffusion region disposed in the substrate, the diffusion region comprising a semiconductor channel each having a first longitudinal axis in a first direction. The IC also comprises a dummy gate extending along a second longitudinal axis orthogonal to the first longitudinal axis, the first dummy gate disposed above the diffusion region. The IC also comprises a conducting gate extending along a third longitudinal axis orthogonal to the first longitudinal axis, the conducting gate disposed above the diffusion region and adjacent to a first side of the dummy gate by a gate pitch. The IC also comprises a circuit. The circuit comprises a FET in the diffusion region. The FET comprises a semiconductor channel structure in the diffusion region, a first gate comprising a first active gate in a portion of the conducting gate disposed above the semiconductor channel structure, a source in a first end portion of the semiconductor channel structure, and a drain in a second end portion of the semiconductor channel structure. The IC also comprises a signal output node connected to at least one of the source and the drain of the FET. The IC also comprises an output contact disposed in a first output contact area above the signal output node and in contact with the signal output node. The IC also comprises an output metal interconnect line disposed above the output contact and in contact with the output contact and extending to a second output contact area outside the first output contact area, the second output contact area adjacent to a second side of the dummy gate opposite of the first side of the dummy gate. The IC also comprises a first via disposed above and in contact with the output metal interconnect line in the first output contact area. The IC also comprises a second via disposed above and in contact with the output metal interconnect line in the second output contact area.

In another exemplary aspect, an IC is provided. The IC comprises a substrate. The IC also comprises a means for providing a diffusion disposed in the substrate, the means for providing the diffusion comprising a means for providing a semiconducting channel. The IC also comprises a means for providing isolation extending above the means for providing the diffusion. The IC also comprises a means for providing a conduction path disposed above the means for providing the diffusion, the means for providing the conduction path adjacent to a first side of the means for providing isolation. The IC also comprises a circuit. The circuit comprises a FET in the means for providing a diffusion. The FET comprises a semiconductor channel structure in the means for providing a diffusion, a first gate comprising a first active gate in a portion of the means for providing a conduction path disposed above the semiconductor channel structure, a source in a first end portion of the semiconductor channel structure, and a drain in a second end portion of the semiconductor channel structure. The IC also comprises a signal output node connected to at least one of the source and the drain of the FET. The IC also comprises a means for providing an output contact disposed in a first output contact area above the signal output node and in contact with the signal output node. The IC also comprises a means for interconnecting the means for providing interconnection to the means for providing an output contact and disposed above the means for providing the output contact extending to a second output contact area outside the first output contact area, the second output contact area adjacent to a second side of the means for providing isolation opposite of the first side of the means for providing isolation. The IC also comprises a first means for providing a first vertical interconnect disposed above and in contact with the means for interconnecting the means for providing interconnection to the means for providing the output contact in the first output contact area. The IC also comprises a second means for providing a second vertical interconnect disposed above and in contact with the means for interconnecting the means for providing interconnection to the means for providing the output contact in the second output contact area.

In another exemplary aspect, a method of fabricating IC is provided. The method comprises forming a substrate. The method comprises forming a diffusion region in the substrate comprising a semiconductor channel having a first longitudinal axis in a first direction. The method also comprises forming a dummy gate above the diffusion region and extending along a second longitudinal axis orthogonal to the first longitudinal axis. The method also comprises forming a conducting gate above the diffusion region and adjacent to a first side of the dummy gate by a gate pitch and extending along a third longitudinal axis orthogonal to the first longitudinal axis. The method also comprises forming a circuit comprising a FET in the diffusion region. The FET comprises a semiconductor channel structure in the diffusion region, a first gate comprising a first active gate in a portion of the conducting gate disposed above the semiconductor channel structure, a source in a first end portion of the semiconductor channel structure, and a drain in a second end portion of the semiconductor channel structure. The method also comprises forming a signal output node connected to at least one of the source and the drain of the FET. The method also comprises forming an output contact disposed in a first output contact area above the signal output node and in contact with the signal output node. The method also comprises forming an output metal interconnect line disposed above the output contact and in contact with the output contact and extending to a second output contact area outside the first output contact area, the second output contact area adjacent to a second side of the dummy gate opposite of the first side of the dummy gate. The method also comprises forming a first via disposed above and in contact with the output metal interconnect line in the first output contact area. The method also comprises forming a second via disposed above and in contact with the output metal interconnect line in the second output contact area.

BRIEF DESCRIPTION OF THE FIGURES

FIG. 5B-1 is a cross-sectional view of the IC in FIG. 5A orthogonal to the gates in the IC to further illustrate the second output via coupled to the output metal interconnect extending between the first output contact connected to the signal output node of the circuit(s) in FIG. 5A and the second output contact area in a diffusion break area above a diffusion break in a substrate;

FIG. 5B-2 is another cross-sectional view of the IC in FIG. 5A across a dummy gate adjacent to the second output contact area illustrating the FETs of the circuit formed in the IC are Fin Field-Effect Transistors (FETs) (FinFETs) and further illustrating the output vias coupled to the output metal interconnect;

FIG. 5B-3 is another cross-sectional view of the IC in FIG. 5A across active gates of the FETs of the circuit to the illustrate the respective output vias of the FETs coupled to their respective output metal interconnects;

FIG. 9B-1 is a cross-sectional view of the IC in FIG. 9A orthogonal to the gates in the IC to further illustrate the second output via coupled to the output metal interconnect extending between the first output contact connected to the signal output node of the circuit(s) in FIG. 9A and the second output contact area;

FIG. 9B-2 is another cross-sectional view of the IC in FIG. 9A across a dummy gate adjacent to the second output contact area illustrating that the FETs of the circuit formed in the IC are Fin Field-Effect Transistors (FETs) (FinFETs) and further illustrating the output vias coupled to the output metal interconnect;

FIG. 9B-3 is another cross-sectional view of the IC in FIG. 9A across active gates of the FETs of the circuit to illustrate the respective output vias of the FETs coupled to their respective output metal interconnects;

DETAILED DESCRIPTION

Figure 1:
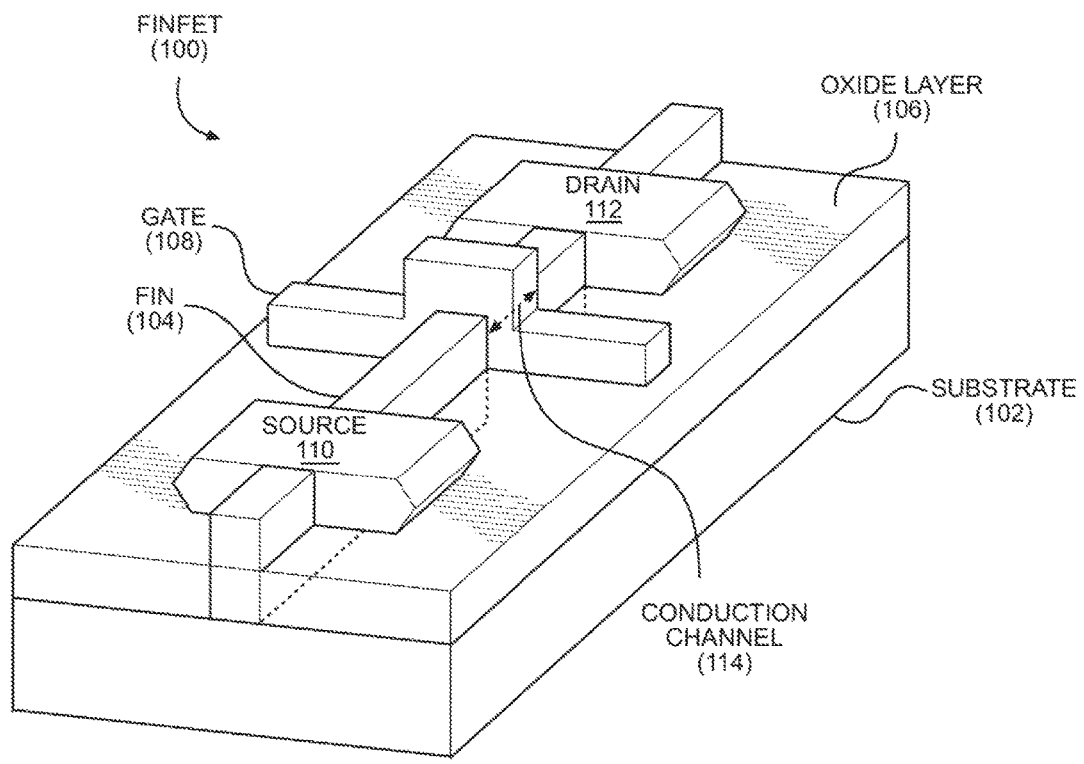
FIG. 1 is a perspective view of an exemplary Fin Field-Effect Transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuits (ICs) employing additional vertical interconnect access(es) (via(s)) coupled to a circuit output via to decrease circuit output resistance. Related methods are also disclosed. For example, the IC may be realized in a cell circuit that is laid out according to a circuit cell architecture, such as a standard cell for complementary metal oxide semiconductor (CMOS) circuits. In exemplary aspects disclosed herein, an integrated circuit (IC) is provided that includes a diffusion region(s) formed in a substrate. Semiconductor structures of semiconducting material are formed in the substrate in the diffusion region(s) of the IC to form semiconductor channel structures. A source and drain can be formed on end portions of the semiconductor channel on adjacent sides of an active gate of a gate disposed above a semiconductor channel structure to form a Field-Effect Transistor (FET). Metal contacts are formed in contact with the gate, source, and drain of the FET to provide connectivity to the FET. Vias are formed in contact with the metal contacts to extend connectivity to the FET into upper metal interconnect layers. Multiple FETs can be formed and interconnected to each other to form a circuit as part of the IC, wherein the circuit is configured to generate an output signal on at least one of a source and drain of an output FET(s) as a signal output node as a function of an input signal. The output resistance of the signal output node of the circuit is a function of the resistance of the metal contact and an output via coupled to the signal output node. An increased output resistance increases current-resistance (IR) drop and output delay of the circuit. Thus, in exemplary aspects disclosed herein, to reduce the output resistance of the signal output node of the circuit, an output metal interconnect is formed in the IC that extends between a first output contact connected to the output FET in a first output contact area, and across an adjacent dummy gate to a second output contact area on the opposite side of the dummy gate from the signal output node. At least one additional, second output via is connected to the output metal interconnect in the second output contact area. A metal line in a metal layer above the diffusion area and metal contacts is connected to the output via and second output via having parallel output via resistances which reduces the output via resistance of the output FET(s) of the circuit, and thus reduces the overall resistance of the signal output node of the circuit. In this manner, the current-resistance (IR) drop and the output delay as a result of the resistance of the signal output node of FET may be reduced.

In one exemplary aspect, the second output contact area for connecting the second output via to the signal output node is on the opposite side of the dummy gate from the signal output node of the circuit in a diffusion break area above the diffusion break in the substrate. The diffusion break area is in an existing "white space" in the IC that may be filled with an interlayer dielectric (ILD) material and is devoid of a semiconductor device structure. This "white space" allows the output metal interconnect that is coupled to the signal output node of the circuit to be extended into the diffusion break area as a second output contact area to support connectivity to a second output via electrically coupled to the signal output node without increasing the area of the IC. In another exemplary aspect, the second output contact area for connecting the second output via to the signal output node is formed by forming a second dummy gate in the IC, which may increase the area in the IC. The second dummy gate is adjacent to a first dummy gate which is adjacent to the signal output node of the circuit. The output metal interconnect extends between the first output contact connected to the output FET, and across the first dummy gate to a second output contact area between the first and second dummy gates. A second metal contact can be formed that extends between the diffusion area of the IC and a region of the output metal interconnect in the second output contact area between the first and second dummy gates.

Figure 4:
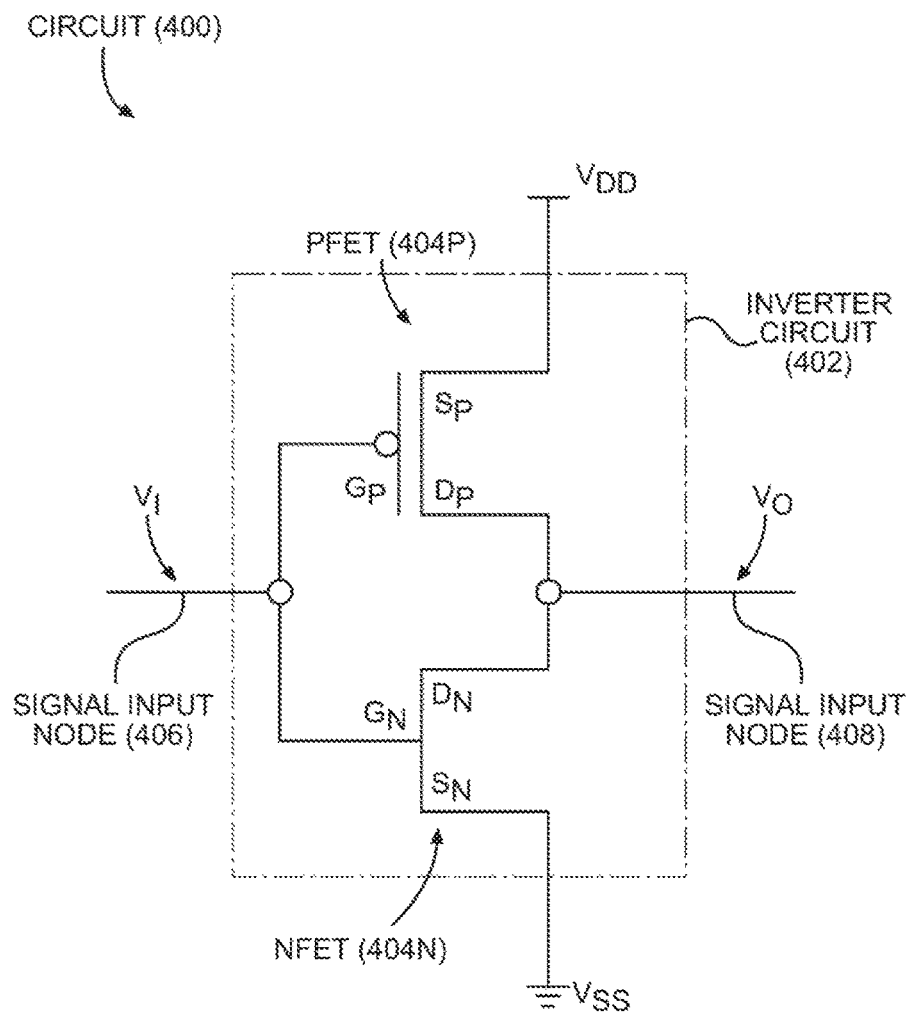
FIG. 4 is a schematic diagram of an inverter circuit that is formed by a complementary metal oxide semiconductor (CMOS) circuit that is configured to generate a voltage signal on a signal output node as an inverted state of the voltage signal on an input node.

FIG. 4 a schematic diagram of an exemplary circuit 400 in the form of an inverter circuit 402 that can be fabricated to employ additional vias coupled to a circuit output via to decrease circuit output resistance, and as a result reduce IR drop and decrease delay. Exemplary ICs that can be employed to fabricate the circuit 400 in FIG. 4 will be discussed in more detail below starting at FIG. 5A. As shown in FIG. 4, the inverter circuit 402 is a CMOS circuit that includes a PFET 404P and NFET 404N whose respective gates $G_P$, $G_N$ are coupled together to a signal input node 406. The respective drains $D_P$, $D_N$ of the PFET 404P and NFET 404N are coupled together to a signal output node 408. The inverter circuit 402 is configured to generate an output voltage signal $V_O$ on the signal output node 408 that is an inverter voltage level of an input voltage signal $V_I$ on the signal input node 406. The resistance of the PFET 404P and NFET 404N affects the delay of an inversion of the voltage level input voltage signal $V_I$ on the signal input node 406 resulting in an inversion of the output voltage signal $V_O$ on signal output node 408. Thus, it may be desired to reduce the resistance of the PFET 404P and NFET 404N in the inverter circuit 402 to increase speed performance.

Figure 5A:
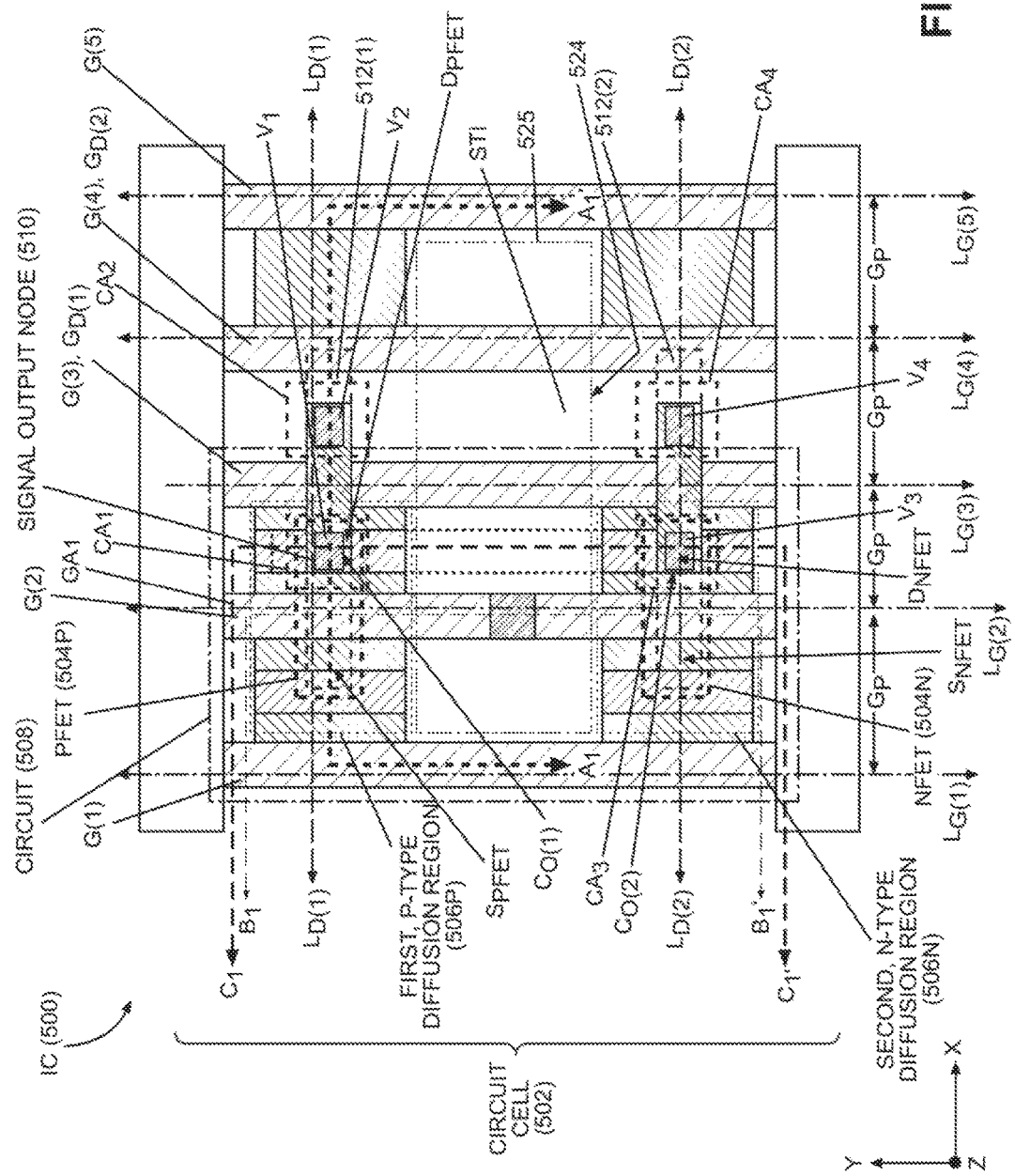
FIG. 5A is a top view of an exemplary integrated circuit (IC) laid out according to a circuit cell architecture and includes a circuit having two output FETs, wherein each FET has a signal output node coupled to a first output contact and first output via, and further includes a second output via coupled to an output metal interconnect that extends between the first output contact connected to the signal output node and a second output contact area in a diffusion break area to reduce the overall output via resistance of the circuit.
Figures 1, 5B:
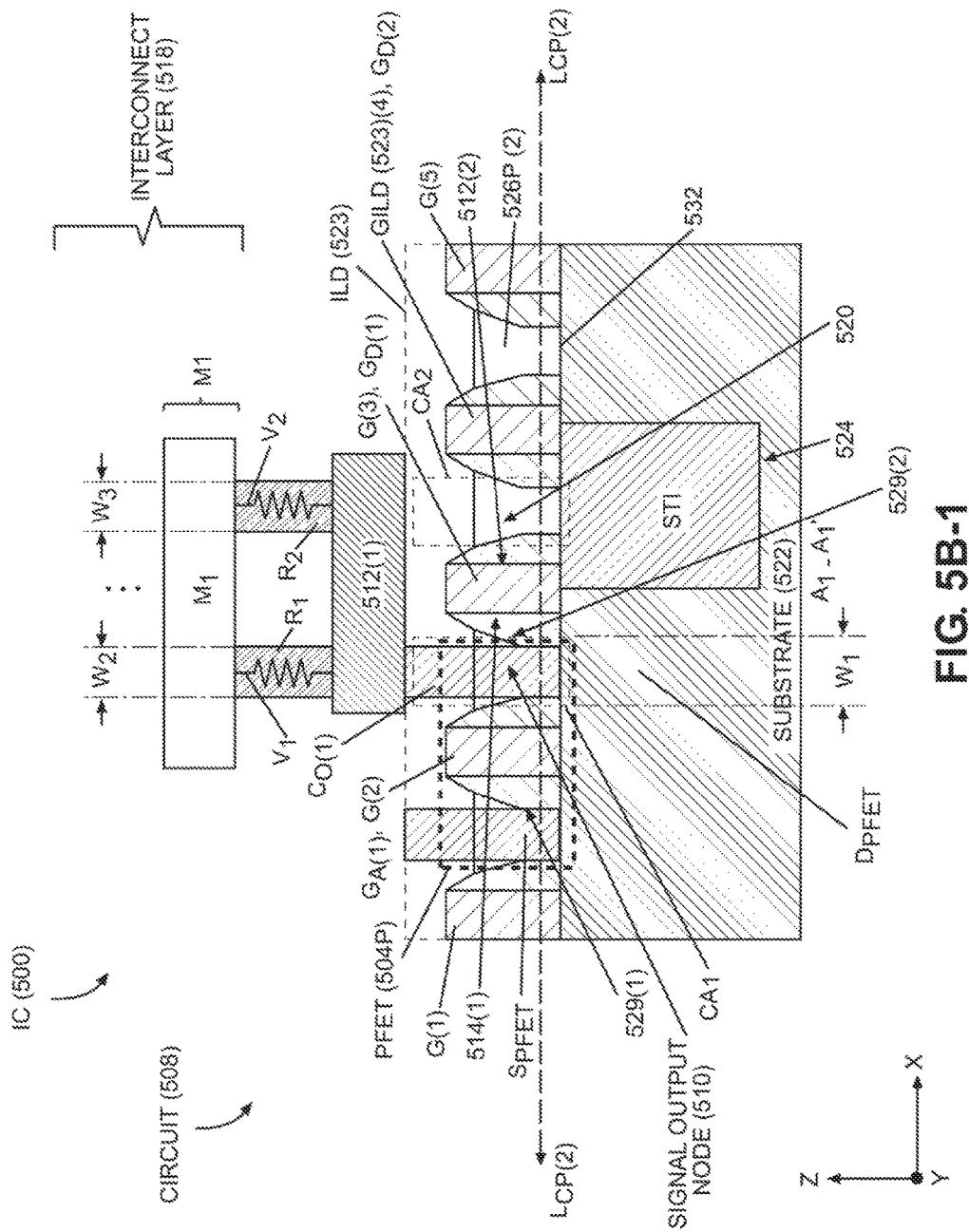
Figures 2, 5B:
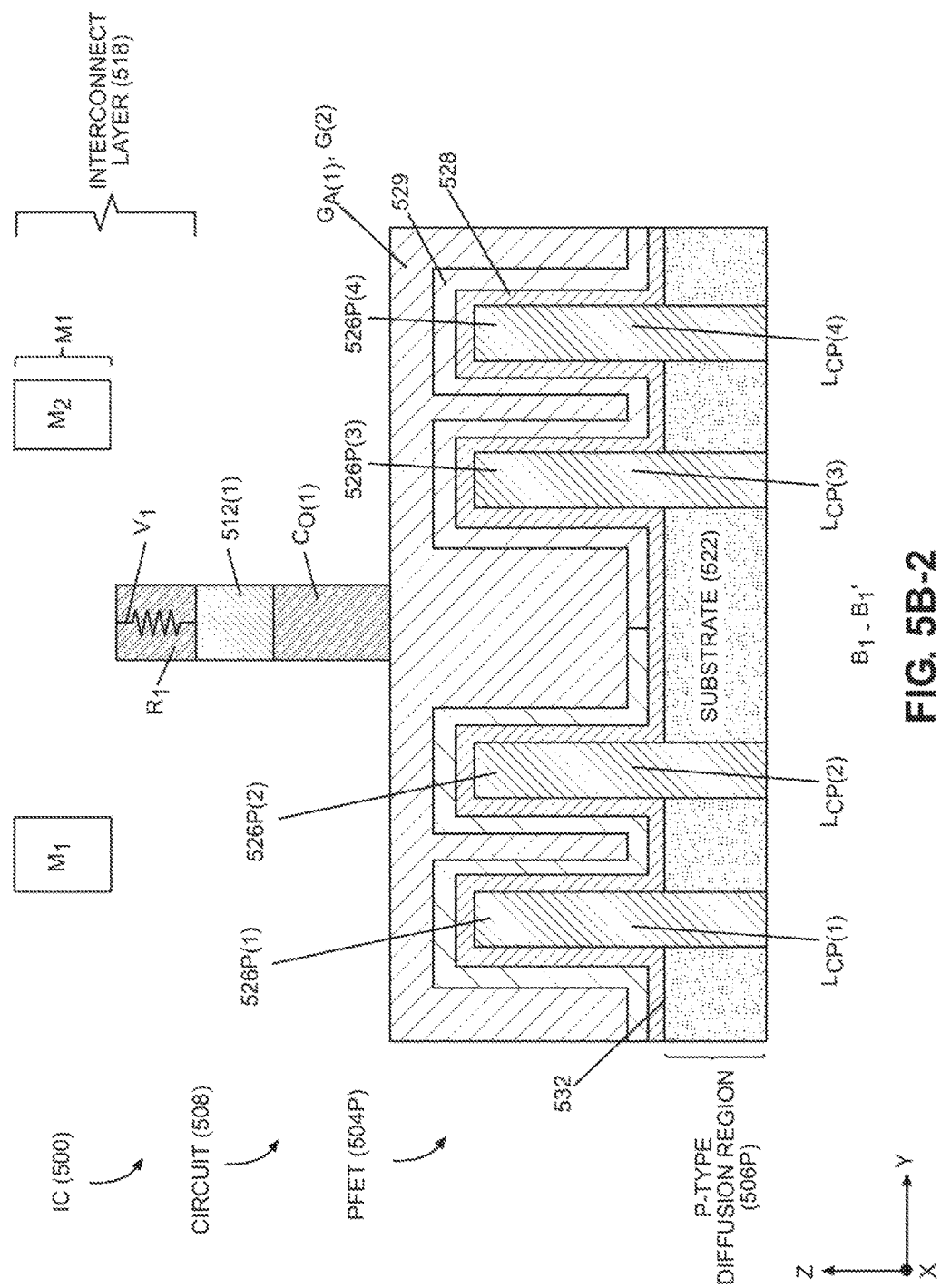
Figures 3, 5B:
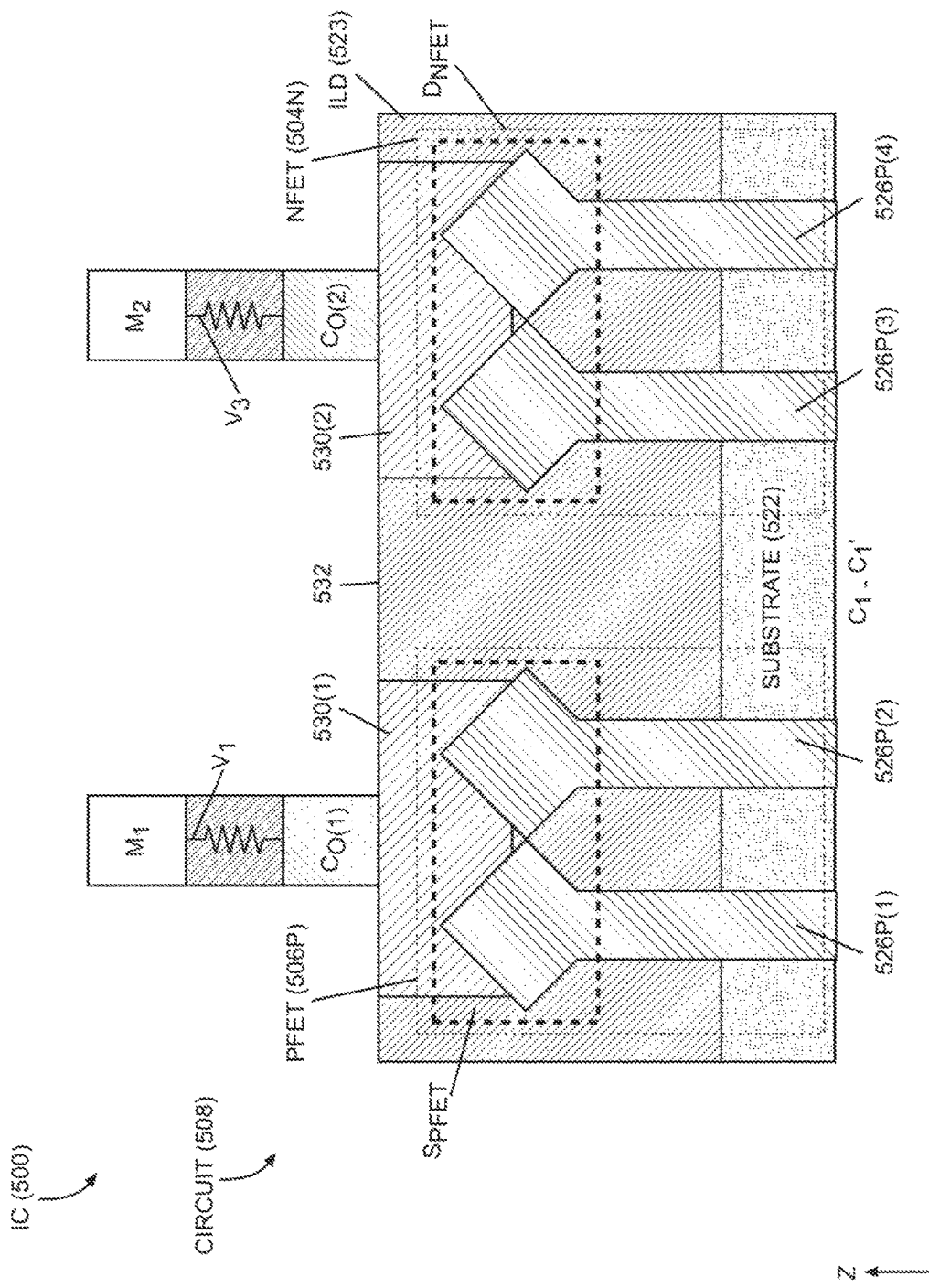

FIGS. 5A-5B-3 illustrate an exemplary IC 500 that can be fabricated to employ additional vias coupled to a circuit output via to decrease circuit output resistance, and as a result reduce IR drop and decrease delay. For example, the inverter circuit 402 in FIG. 4 can be fabricated in the IC 500 in FIGS. 5A-5B-3. The IC 500 may be fabricated in an IC chip. FIG. 5A is a top view of the IC 500 laid out according to an architecture of a circuit cell 502. FIGS. 5B-1-5B-3 are cross-sectional views taken in respective, cross-sections $A_1$-$A_1'$, $B_1$-$B_1'$, and $C_1$-$C_1'$ of the IC 500 shown in FIG. 5A to further illustrate exemplary aspects of the IC 500.

As shown in FIG. 5A, the IC 500 includes a PFET 504P in a first, P-type diffusion region 506P and an NFET 504N in a second, N-type diffusion region 506N. The PFET 504P and NFET 504N may be coupled together to form a circuit 508. For example, drains $D_{PFET}$, $D_{NFET}$ of the respective PFET 504P and NFET 504N may be coupled together, like in the inverter circuit 402 in FIG. 4, to form a signal output node 510 for the circuit 508. The resistance of the signal output node 510 affects the delay and IR drop performance of the circuit 508. As shown in FIG. 5B-1 illustrating the IC 500 across the $A_1$-$A_1'$ cross-section line in FIG. 5A, and as will be discussed in more detail below, in this example, to reduce the output resistance of signal output node 510 of the circuit 508, a first output metal interconnect line 512(1) is formed in the IC 500. The first output metal interconnect line 512(1) is in contact with and extends between the first output contact $C_{O(1)}$ connected to the PFET 504P in a first output contact area $CA_1$, and across an adjacent dummy gate $G_{D(1)}$ to a second output contact area $CA_2$ on the opposite side 514(2) of the dummy gate $G_{D(1)}$ from the side 514(1) of the dummy gate $G_{D(1)}$ adjacent to the signal output node 510. For example, the first output contact $C_{O(1)}$ may have a width $W_1$ of 15 nm as shown in FIG. 5B-1. A first output via $V_1$ is in contact to the first output metal interconnect line 512(1) to provide interconnectivity between the first output contact $C_{O(1)}$ onnected to the PFET 504P and a metal line $M_1$ in a metal layer M1 in an interconnect layer 518 in the IC 500, such as metal one layer M1. As also shown in FIG. 5B-1, a second output via $V_2$ is connected to the first output metal interconnect line 512(1) in the second contact area $CA_2$. For example, the first and second output vias $V_1$, $V_2$ may have respective widths $W_2$, $W_3$ of approximately 15 nm as shown in FIG. 5B-1. The second output contact area $CA_2$ is in a diffusion break area 520 between adjacent dummy gates $G_{D(1)}$, $G_{D(2)}$ above a trench isolation structure STI in the substrate 522 forming a diffusion break 524. The diffusion break area 520 provides a "white space" filled with an interlayer dielectric material (ILD) 523 as shown in FIG. 5B-1 and devoid of a semiconductor material or device for the second output contact area $CA_2$ in the circuit 508 so that the first output metal interconnect line 512(1) can extend into second output contact area $CA_2$ for supporting the second output via $V_2$ without interfering with other structures in the IC 500. In this example, the second output contact area $CA_2$ is the area above the diffusion break 524 and above the top surface 532 of the substrate 522 between the adjacent dummy gates $G_{D(1)}$, $G_{D(2)}$. In this example, the second output contact area $CA_2$ does not include any conducting structure or semi-conducting structures. As shown in FIG. 5B-1, the metal line $M_1$ contacts the first and second output vias $V_1$, $V_2$ having parallel output via resistances $R_1$, $R_2$, which reduces the resistance of the PFET 504P and reduces the overall resistance of the signal output node 510 of the circuit 508. In this manner, the IR drop and the output delay as a result of the resistance of the signal output node 510 of the circuit 508 may be reduced for increased performance.

Figure 2:
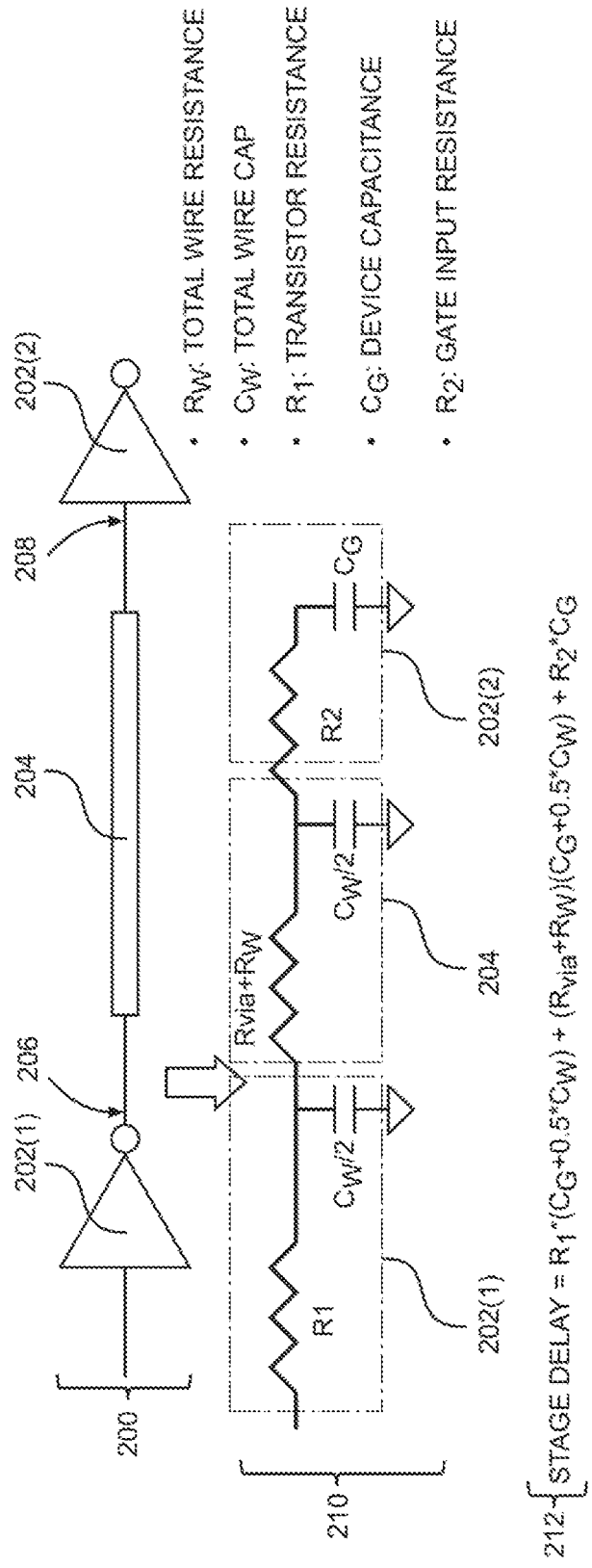
FIG. 2 is a diagram of a circuit illustrating resistance and capacitance stage delay.
Figure 3A:
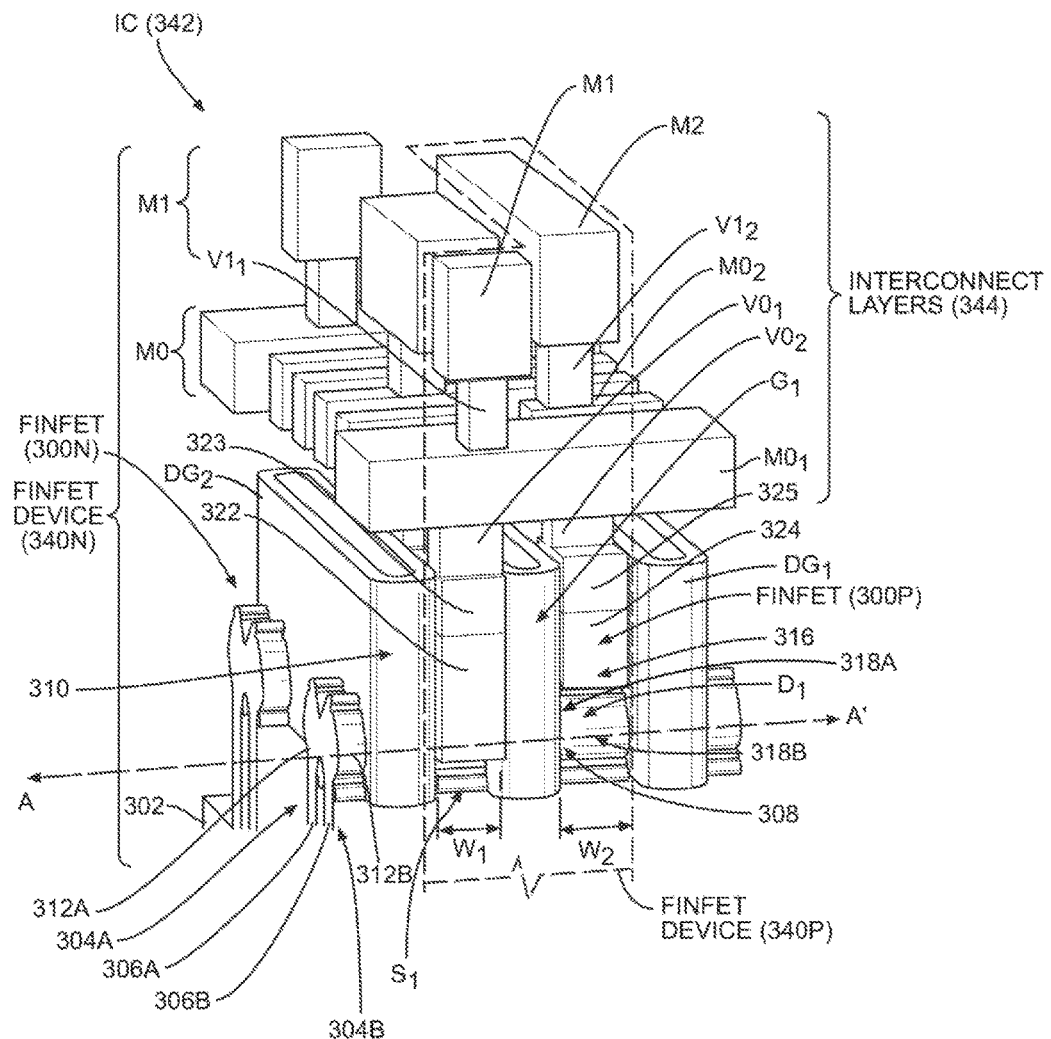
FIG. 3A is a perspective view of an exemplary FinFET illustrating the fin channel structures, sources and drains formed in end portions of the fins, gates formed around the fin channel structures and gate, source, and drain contacts to provide interconnections to the gate, source, and drain in interconnect layers.
Figure 3B:
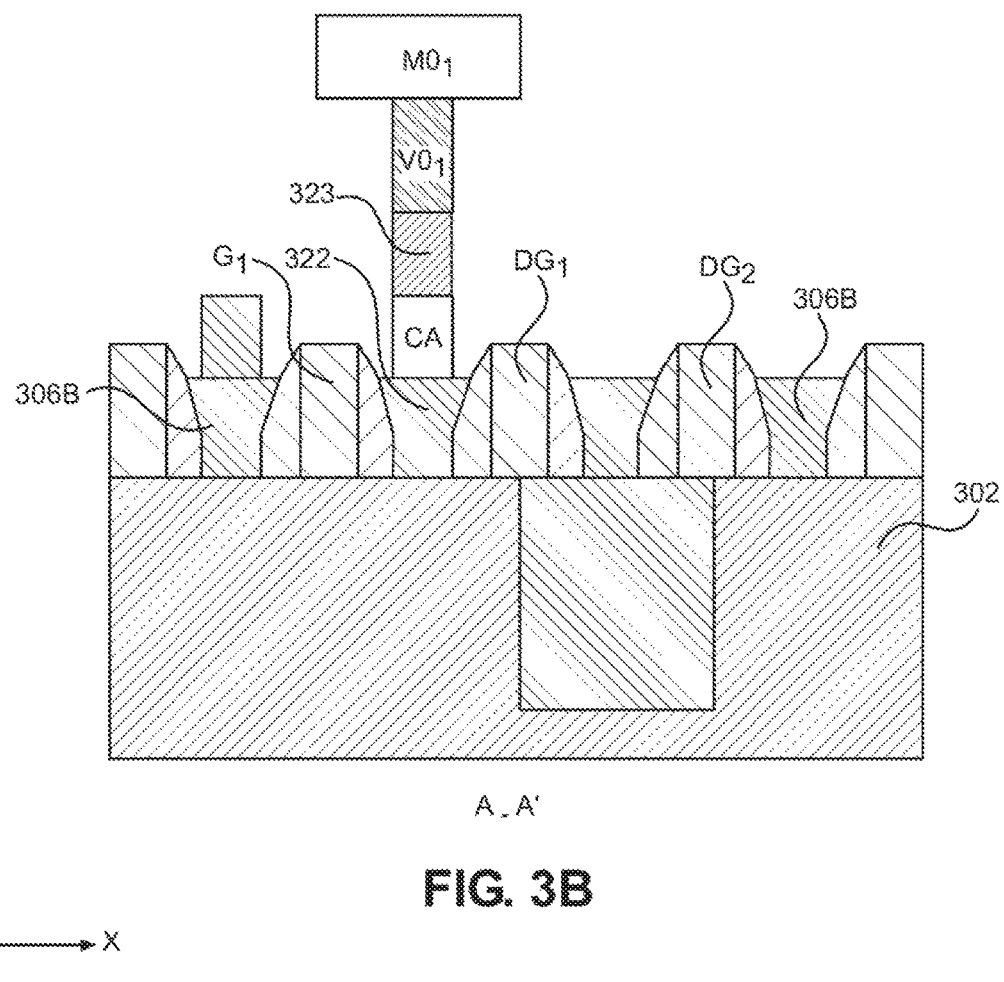
FIG. 3B is a side view of the FinFET in FIG. 3A further illustrating a source/drain contact in contact with a source/drain of the FinFET, a contact metal in contact with the source/drain contact, a via in contact with the contact metal and a metal line in contact with the via to provide an interconnection between the source/drain of the FinFET.

Further, in this example, the IC 500 is fabricated according to a CMOS cell architecture. Thus, as shown in FIG. 5A, the IC 500 also includes the NFET 504N in a second, N-type diffusion region 506N. Like the PFET 504P illustrated in FIG. 5B-1, to further reduce the output resistance of signal output node 510 of the circuit 508 in which the drain $D_{NFET}$ is also coupled, a second output metal interconnect line 512(2) is also formed in the IC 500. The second output metal interconnect line 512(2) is in contact with and extends between the second output contact $C_{O(2)}$ connected to the NFET 504N in a third output contact area $CA_3$. A third output via $V_3$ is in contact with the second output metal interconnect line 512(2) to provide interconnectivity between the second output contact $C_{O(2)}$ connected to the NFET 504N and a second metal line $M_2$ in the interconnect layer 518 in the IC 500, such as metal one layer M1. A fourth output via $V_4$ is also connected to the second output metal interconnect line 512(2) in the fourth output contact area $CA_4$. The fourth output contact area $CA_4$ is in diffusion break area 520 above a trench isolation structure STI in the substrate 522. As shown in FIGS. 5B-2 and 5B-3, which illustrate the IC 500 across the respective $B_1$-$B_1'$ and $C_1$-$C_1'$ cross-section lines in FIG. 5A, a second metal line $M_2$ is provided that contacts the third and fourth output vias $V_3$, $V_2$ in FIG. 5A having parallel output via resistances, which reduces the resistance of the PFET 504P to reduce the overall resistance of the signal output node 510 of the circuit 508. In this manner, the IR drop and the output delay as a result of the resistance of the signal output node 510 of the circuit 508 may be further reduced for increased performance.

Turning back to FIG. 5A, the P-type diffusion region 506P extends along a longitudinal axis $L_{D(1)}$ and may be formed by doping a portion of the semiconductor substrate 522 (e.g., Silicon (Si)) with an impurity material that is able to leave holes in the substrate 522. Similarly, N-type diffusion region 506N extends along a longitudinal axis $L_{D(2)}$ parallel to the longitudinal axis $L_{D(1)}$ and may be formed by doping a portion a semiconductor substrate 522 (e.g., Silicon (Si)) with a pentavalent impurity material such as a donor material that is able to give up free electrons in the substrate 522. A non-diffusion region 525 is between the P-type diffusion region 506P and the N-type diffusion region 506N. The non-diffusion region 525 having a longitudinal axis $L_{ND}$ in the X-axis direction between the P-type diffusion region 506P and the N-type diffusion region 506N in the circuit 508.

As shown in FIGS. 5B-2 and 5B-3, P-type semiconductor channel structures 526P(1)-526P(4) in the form of "Fins" are formed in the circuit 508 above the substrate 522 and extended along longitudinal axes $L_{C(N)}$, $L_{(C)P}$ in the X-axis direction, such that the PFET 504P and NFET 504N are respective P-type FinFET and N-type FinFET. Note that although not shown in FIGS. 5B-2 and 5B-3, the N-type diffusion region 506N in the circuit 508 in FIG. 5A also includes similar semiconductor channel structures to the P-type semiconductor channel structures 526P(1)-526P(4). As shown in FIGS. 5A and 5B-1, gates G(1)-G(5) are formed in the circuit 508 along longitudinal axes $L_{G(1)}$-$L_{G(5)}$ in the Y-axis direction, orthogonal to the longitudinal axes $L_{CP(1)}$-$L_{CP(1)}$ of the P-type semiconductor channels 526P(1)-526P(4) in the X-axis direction, and extend above and around at least a portion of the P-type semiconductor channels 526P(1)-526P(4). Gates G(1), G(2), G(5) are conducting gates of a conductive material, such as metal that can form active gates (referred to herein as "active gates" G(1), G(2), or G(5)). Gate G(3), $G_{D(1)}$ and gate G(4), $G_{D(2)}$ are dummy gates of a dielectric material (referred to herein as "dummy gates" $G_{D(1)}$ or $G_{D(1)}$). The gates G(1)-G(5) are spaced apart from each other by a gate pitch $G_P$ (e.g., 50-60 nanometers (nm)).

As shown in FIG. 5B-1, a diffusion break 524 is shown formed in the P-type diffusion region 506P of the circuit 508 in the form of a double diffusion break (DDB). A trench isolation structure STI formed in the substrate 522 along with the two adjacent dummy gates $G_{D(1)}$ or $G_{D(2)}$ form the diffusion break 524. Note that the diffusion break 524 also extends through the non-diffusion region 525 and N-type diffusion region 506N as shown in FIG. 5A. As shown in FIGS. 5A and 5B-2, the active gate $G_{A(1)}$ is formed around the P-type semiconductor channel structures 526P(1)-526P(4) separated by work function layers comprising a work function metal layer 528 and a dielectric layer 529. Similarly, as shown in FIG. 5A, the active gate $G_A(1)$ is also formed in the N-type diffusion region 506N to form an active gate for the NFET 504N. As shown in FIG. 5B-3, in this example, the source $S_{PFET}$ and drain $D_{PFET}$ of the PFET 504P are epitaxially grown on respective end portions of the P-type semiconductor channel structures 526P(1)-526P(4) although not limited to such. For example, this is shown for semiconductor channel structure 526P(2) in FIG. 5B-1 where the source $S_{PFET}$ and drain $D_{PFET}$ of the PFET 504P are formed on end portions 529(1), 529(2) of the semiconductor channel structure 526P(2). Metal contacts 530(1), 530(2) are formed in contact with the source $S_{PFET}$ and drain $D_{PFET}$ in areas that were etched out of the substrate 522 below a top surface 532 of the substrate 522 in the P-type diffusion region 506P in this example. Although not shown in FIG. 5B-3, the source $S_{NFET}$ and drain $D_{NFET}$ of the NFET 504N may also be epitaxially grown on N-type semiconductor channel structures with metal contacts formed in contact with the source $S_{NFET}$ and drain $D_{NFET}$ in areas that were etched out of the substrate 522 below a top surface 532 of the substrate 522 in the N-type diffusion region 506N.

Figure 6:
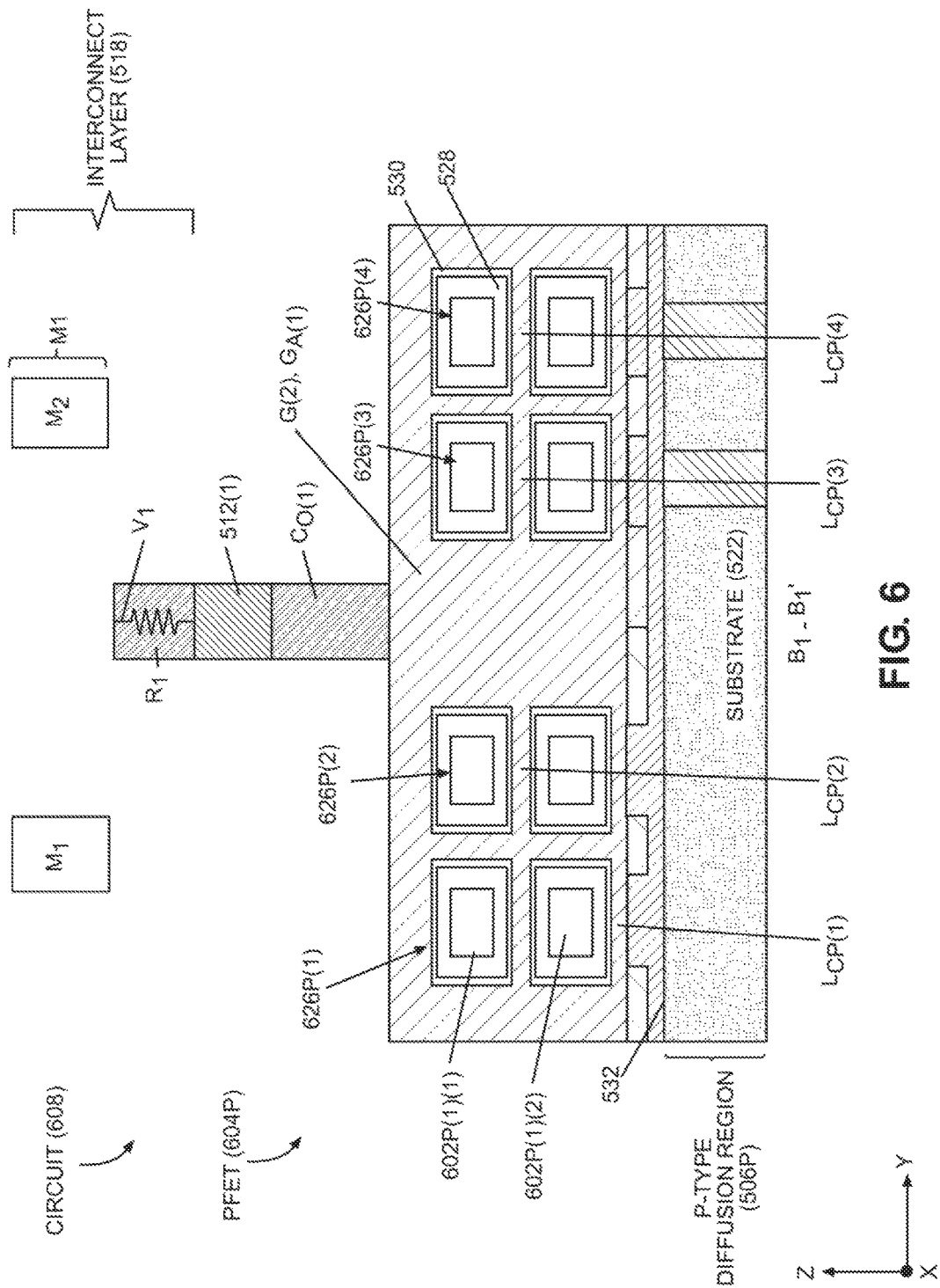
FIG. 6 is an alternative cross-sectional view of the cross-sectional view of the IC in FIG. 5B-2, with the FETs of the circuit formed in the IC in FIG. 5A as a gate-all-around (GAA) FET(s) and to illustrate the output vias coupled to the output metal interconnect.

As discussed above, the PFET 504P and NFET 504N formed in the circuit 508 in FIGS. 5A-5B-3 are FinFETs. However, the PFET 504P and NFET 504N are not limited to FinFETs. For example, the PFET 504P and NFET 504N could be fabricated in the IC 500 as a gate-all-around (GAA) FET or planar FET, as examples, to form a circuit. In this regard, FIG. 6 illustrates a PFET 604P in the form of a GAA FET that can be formed on the IC 500 in FIG. 5A in lieu of the PFET 504P. FIG. 6 is an alternative view of the IC 500 in FIG. 5A across the cross-sectional line $B_1$-$B_1'$. Common structures between the FinFET PFET 504P in FIG. 5B-2 and the GAA PFET 604P in FIG. 6 are shown with common element numbers and thus will not be re-described. As shown in FIG. 6, the PFET 604P includes semiconductor channel structures 626P(1)-626P(4) in the form of gate-all-around semiconductor structures. Each semiconductor channel structures 626P(1)-626P(4) includes respective nanostructures 602P(1)(1)-602P(4)(2) (e.g., nanowire, nanoslabs) each surrounded by the work metal function layer 528 and dielectric layer 529 and the gate material of the gate G(2). The gate material of the gate G(2) surrounds the nanostructures 602P(1)(1)-602P(4)(2).

Figure 7:
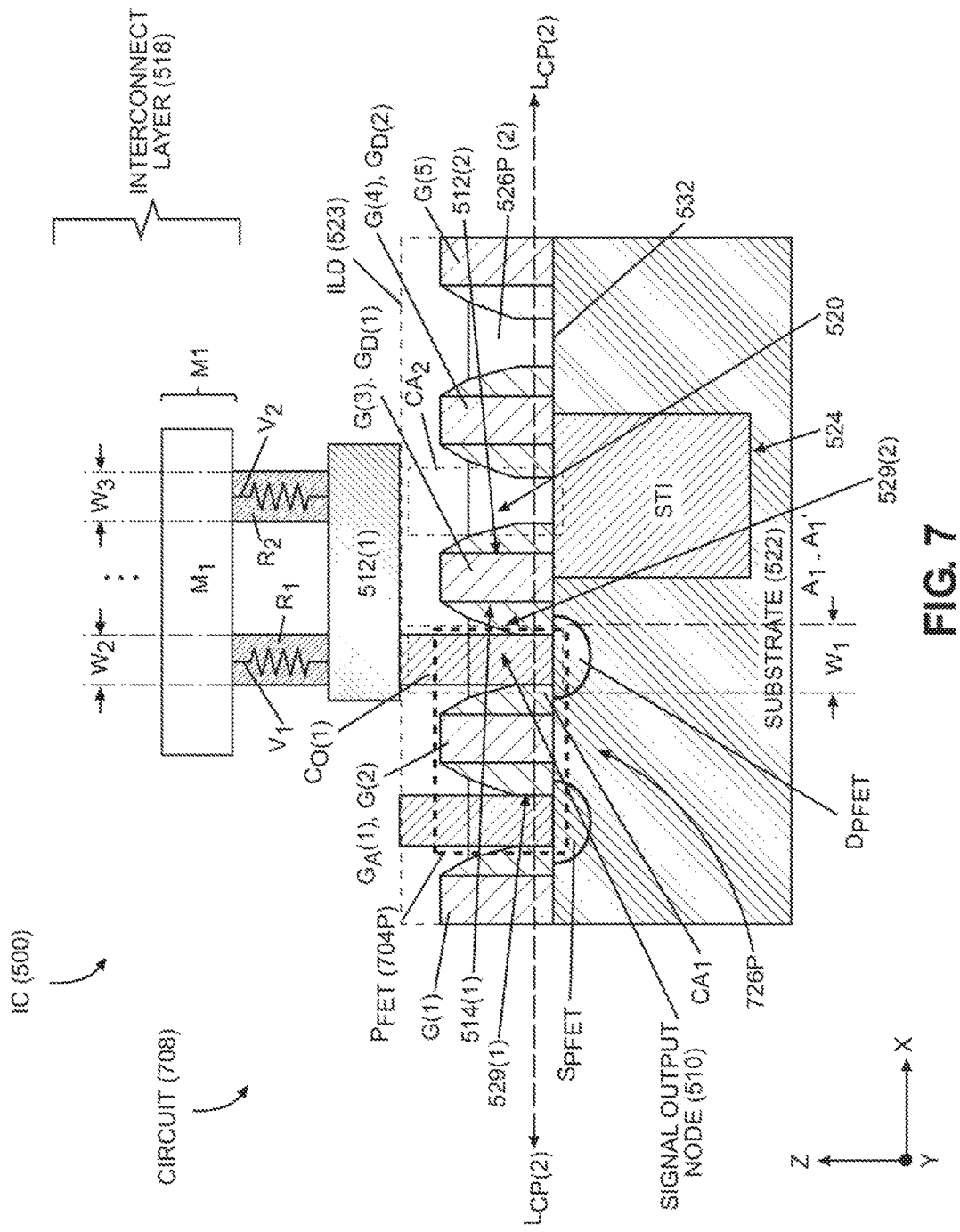
FIG. 7 is an alternative cross-sectional view of the cross-sectional view of the IC in FIG. 5B-1, with the FETs of the circuit formed in the IC in FIG. 5A as planar FETs and to illustrate the second output via coupled to the output metal interconnect extending between the first output contact connected to the signal output node of planar FET(s) in FIG. 5A and the second output contact area.

The PFET 504P and NFET 504N in the circuit 508 could be fabricated in the IC 500 as planar FETs as another example to form a circuit 708 as shown in FIG. 7. In this regard, FIG. 7 illustrates a PFET 704P in the form of a planar FET that can be formed on the IC 500 in FIG. 5A in lieu of the PFET 504P. FIG. 7 is an alternative view of the IC 500 in FIG. 5A across the cross-sectional line $A_1$-$A_1'$. Common structures between the FinFET PFET 504P in FIG. 5B-1 and the planar PFET 704P in FIG. 6 are shown with common element numbers and thus will not be re-described. As shown in FIG. 7, a source $S_{PFET}$ and drain $D_{PFET}$ of the PFET 704P is formed in the substrate 522 below the top surface 532 of the substrate 522. The semiconductor channel structure 726P is formed in the substrate 522 between the source $S_{PFET}$ and drain $D_{PFET}$ the PFET 704P. The active gate $G_{A(1)}$ is disposed above the semiconductor channel structure 726P.

Figure 8A:
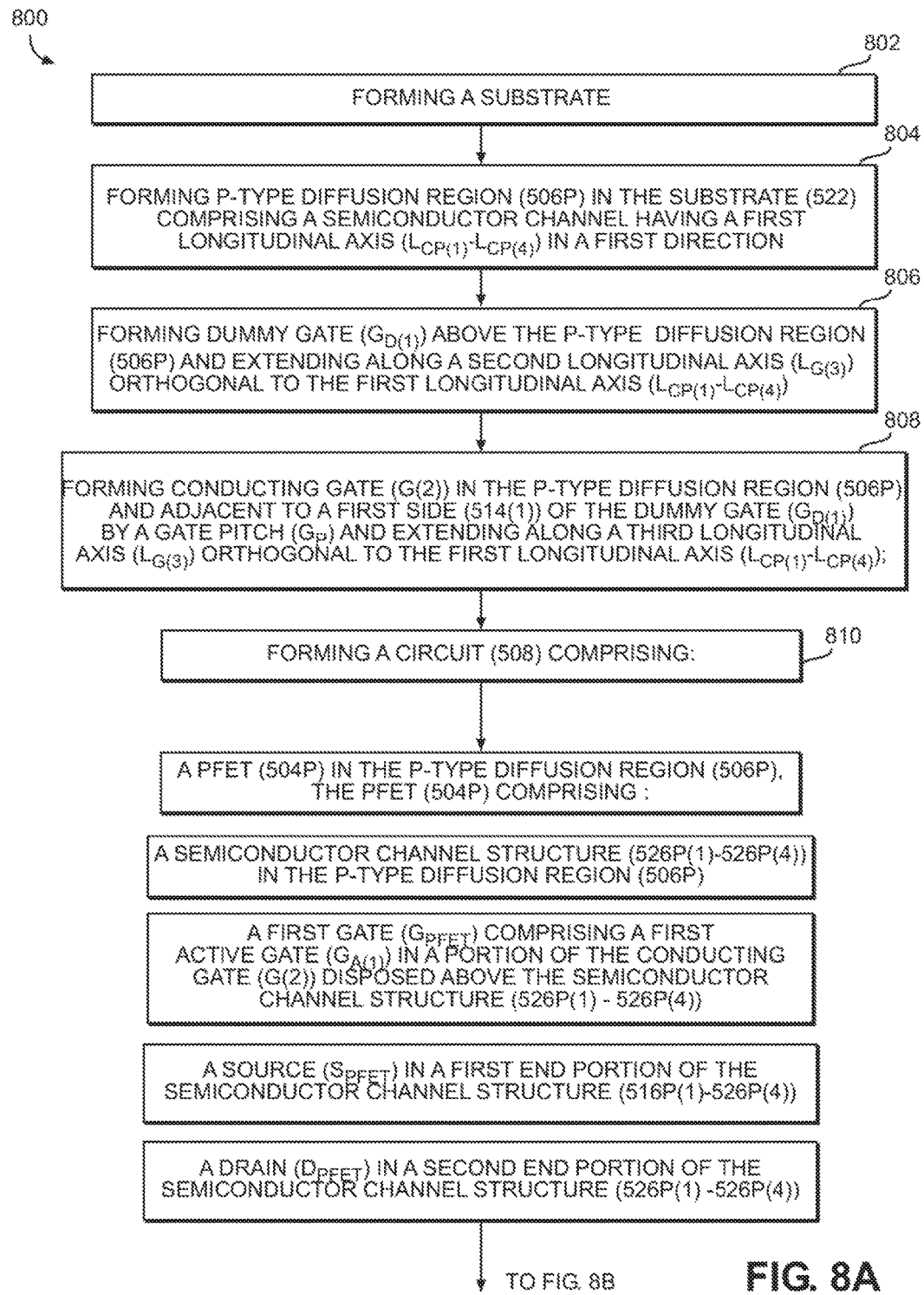
FIGS. 8A and 8B show a flowchart illustrating an exemplary process of fabricating the IC in FIGS. 5A-5B-3.
Figure 8B:
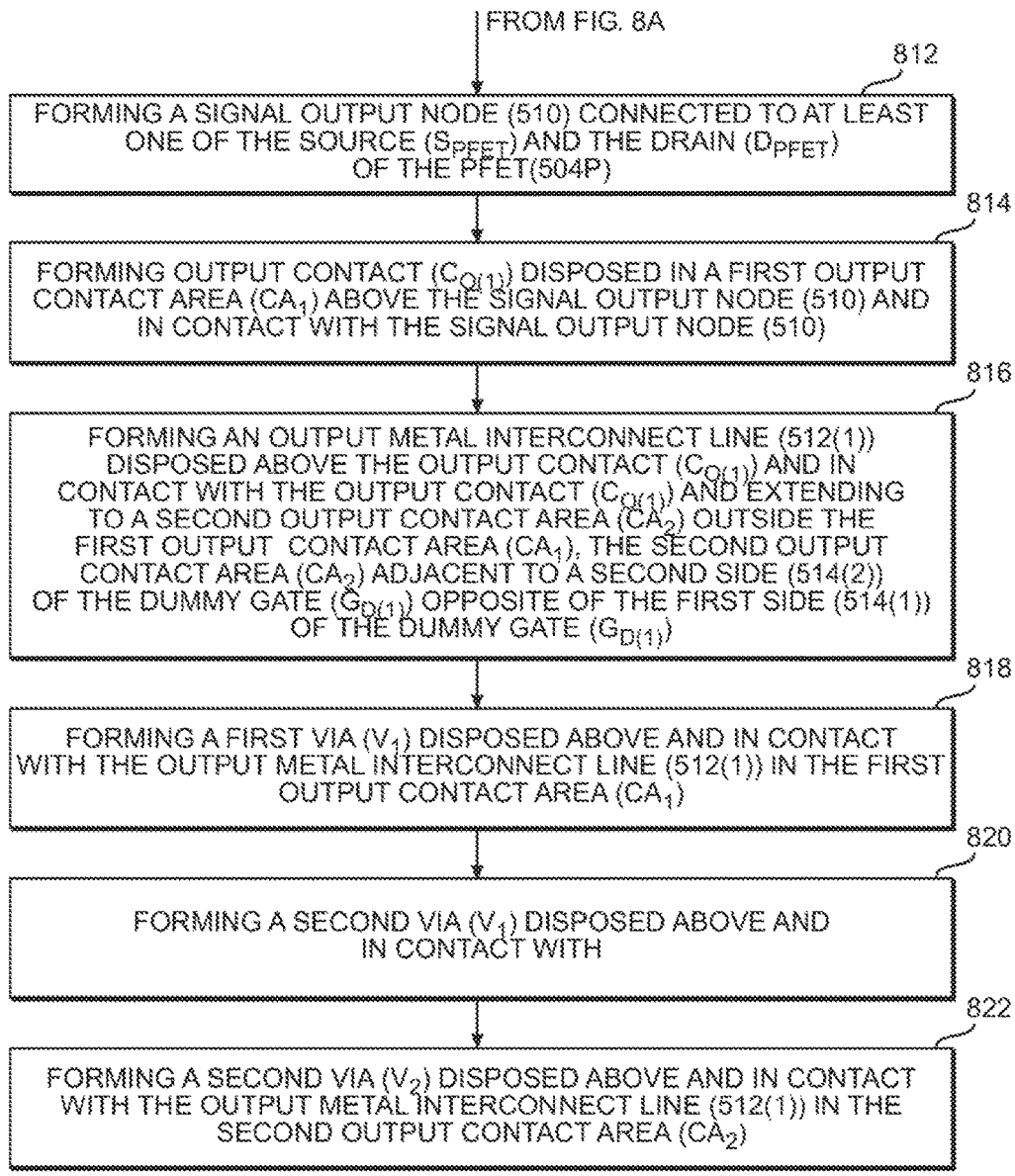

The IC 500 that facilitates the formation of circuits 508, 608, 708 in FIGS. 5A-7 can be fabricated in different fabrication processes. For example, FIGS. 8A and 8B show a flowchart illustrating an exemplary process 800 of fabricating the IC 500 in FIGS. 5A-5B-3. The process 800 in FIGS. 8A and 8B will be described in reference to the PFET 504P formed in IC 500 in the circuit 508 in FIGS. 5A-5B-3. Note however, that this process 800 can also be employed to form the circuits 608, 708 in FIGS. 6 and 7 as well as the circuits 908, 1008, and 1108 in FIGS. 9A-11 to be described later below.

In this regard, as shown in FIGS. 8A and 8B, the process 800 includes forming a substrate 522 (block 802). The process 800 also includes forming diffusion region 506P in the substrate 522 comprising a semiconductor channel having a first longitudinal axis $L_{CP(1)}$-$L_{CP(4)}$ in a first direction (block 804). The process 800 also includes forming a dummy gate $G_{D(1)}$ above the P-type diffusion region 506P and extending along a second longitudinal axis $L_{G(3)}$ orthogonal to the first longitudinal axis $L_{CP(1)}$-$L_{CP(4)}$ (block 806). The process 800 also includes forming a conducting gate G(2) in the P-type diffusion region 506P and adjacent to a first side 514(1) of the dummy gate $G_{D(1)}$ by a gate pitch $G_P$ and extending along a third longitudinal axis $L_{G(2)}$ orthogonal to the first longitudinal axis $L_{CP(1)}$-$L_{CP(4)}$ (block 808). The process 800 also includes forming a circuit 508 in the IC 500 (block 810). The circuit 508 includes a PFET 504P in the P-type diffusion region 506P, the PFET 504P including a semiconductor channel structure 526P(1)-526P(4) in the P-type diffusion region 506P. The PFET 504P also includes a first gate $G_{PFET}$ comprising a first active gate $G_{A(1)}$ in a portion of the conducting gate G(2) disposed above the semiconductor channel structure 526P(1)-526P(4). The PFET 504P also includes a source $S_{PFET}$ in a first end portion of the semiconductor channel structure 526P(1)-526P(4). The PFET 504P also includes a drain $D_{PFET}$ in a second end portion of the semiconductor channel structure 526P(1)-526P(4). The process 800 also includes forming a signal output node 510 connected to at least one of the source $S_{PFET}$ and the drain $D_{PFET}$ of the PFET 504P (block 812). The process also includes forming output contact $C_{O(1)}$ disposed in a first output contact area $CA_1$ above the signal output node 510 and in contact with the signal output node 510 (block 814). The process 800 also includes forming an output metal interconnect line 512(1) disposed above the output contact $C_{O(1)}$ and in contact with the output contact $C_{O(1)}$ and extending to a second output contact area $CA_2$ outside the first output contact area $CA_1$, the second output contact area $CA_2$ adjacent to a second side 514(2) of the dummy gate $G_{D(1)}$ opposite the first side 514(1) of the dummy gate $G_{D(1)}$ (block 816). The process 800 also includes forming a first via $V_1$ disposed above and in contact with the output metal interconnect line 512(1) in the first output contact area $CA_1$ (block 818). The process also includes forming a second via $V_2$ disposed above and in contact with the output metal interconnect line 512(1) in the second output contact area $CA_2$ (block 820).

As discussed above, the circuits 508, 608, 708 that can be formed in the IC 500 in FIGS. 5A-7 include a "white space" filled with an interlayer dielectric material (ILD) 523 and devoid of a semiconductor material or device in the second output contact area $CA_2$ due to the diffusion break area 520 to provide space for extending the output metal interconnect line 512(1) from the first output contact area $CA_1$ into the second output contact area $CA_2$ to support contact to a second via $V_2$ coupled to the first via V1 to reduce resistance of the signal output node 510. Note that some circuits may not include a diffusion break that creates a diffusion break area like the diffusion break area 520 in the circuits 508, 608, 708 in FIGS. 5A-7. In this regard, the gate G(4) in the circuits 508, 608, 708 that can be formed in the IC 500 in FIGS. 5A-7 can also be formed as a dummy gate $G_{D(2)}$ that is devoid of conducting or semi-conducting structures so that area is available between the dummy gates $G_{D(1)}$, $G_{D(2)}$ to extend the output metal interconnect line 512(1) from the first output contact area $CA_1$ into the second output contact area $CA_2$ to support contact of a second via $V_2$ coupled to the first via $V_1$ to reduce resistance of the signal output node 510.

Figure 9A:
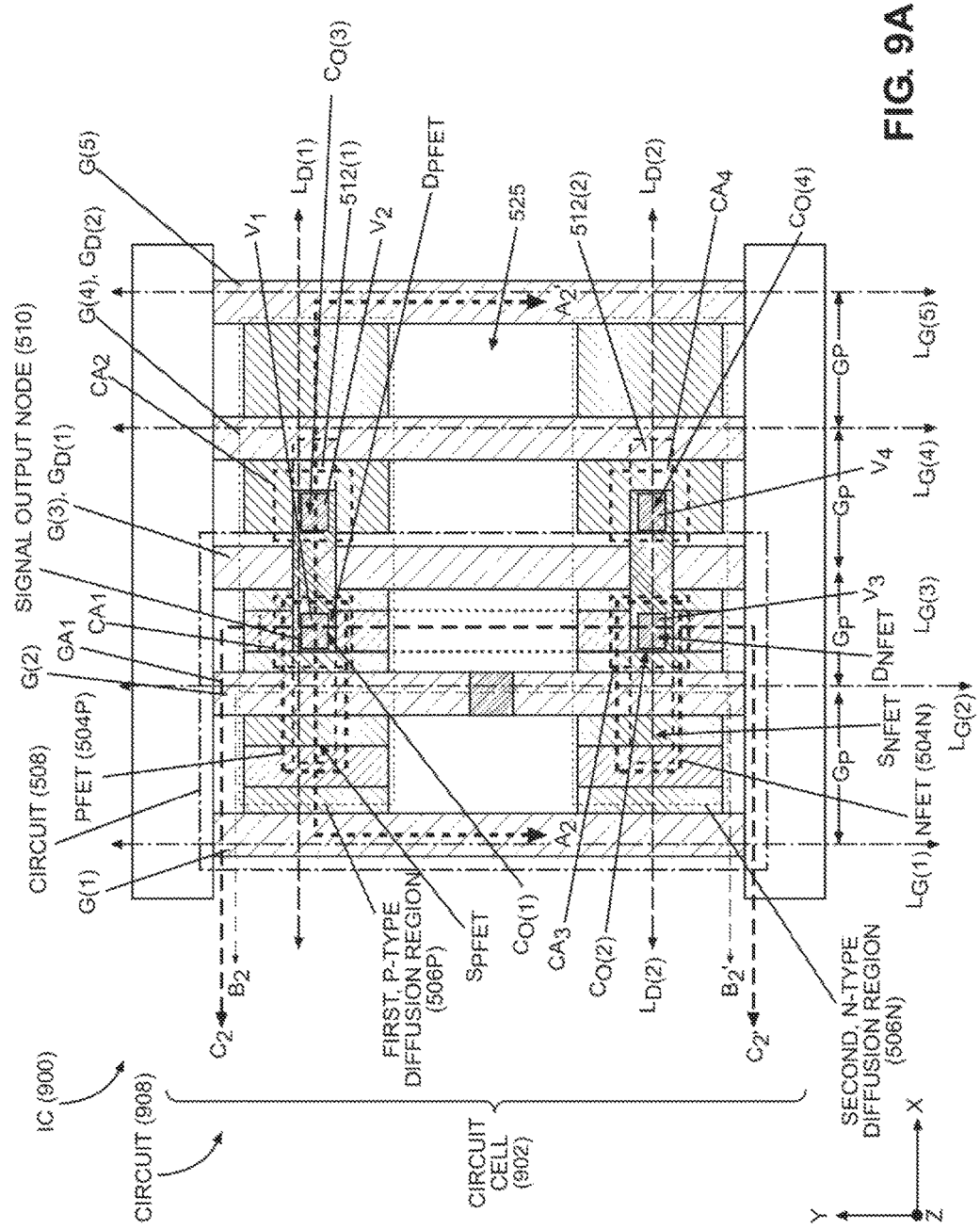
FIG. 9A is a top view of another exemplary IC that includes a circuit having two output FETs, wherein each FET has a signal output node coupled to a first output contact and output via, and further includes a second output via coupled to an output metal interconnect that extends between the first output contact connected to the signal output node and across the first dummy gate to a second output contact area between the first and second dummy gates, to reduce the output via resistance of the circuit.
Figures 1, 9B:
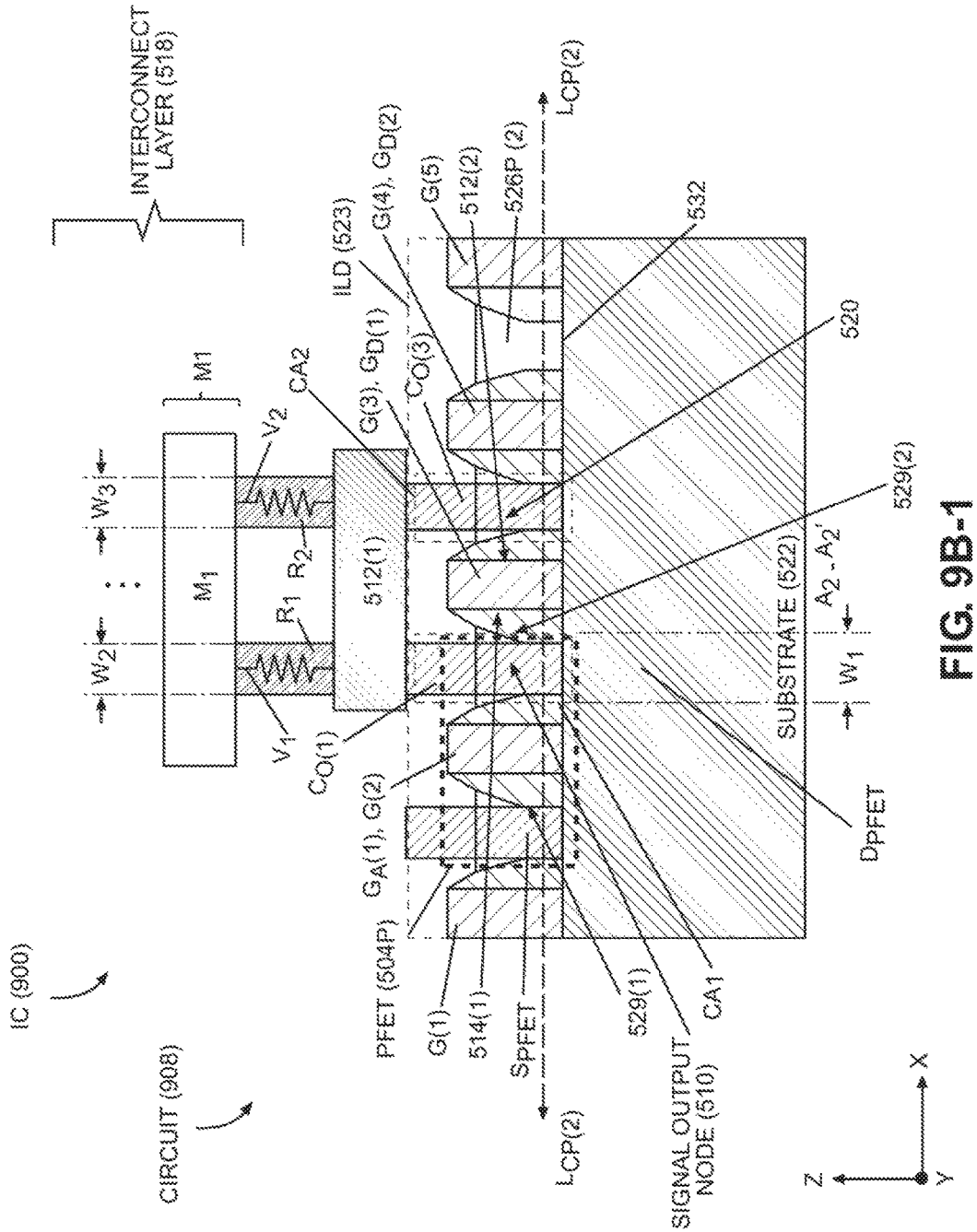
Figures 2, 9B:
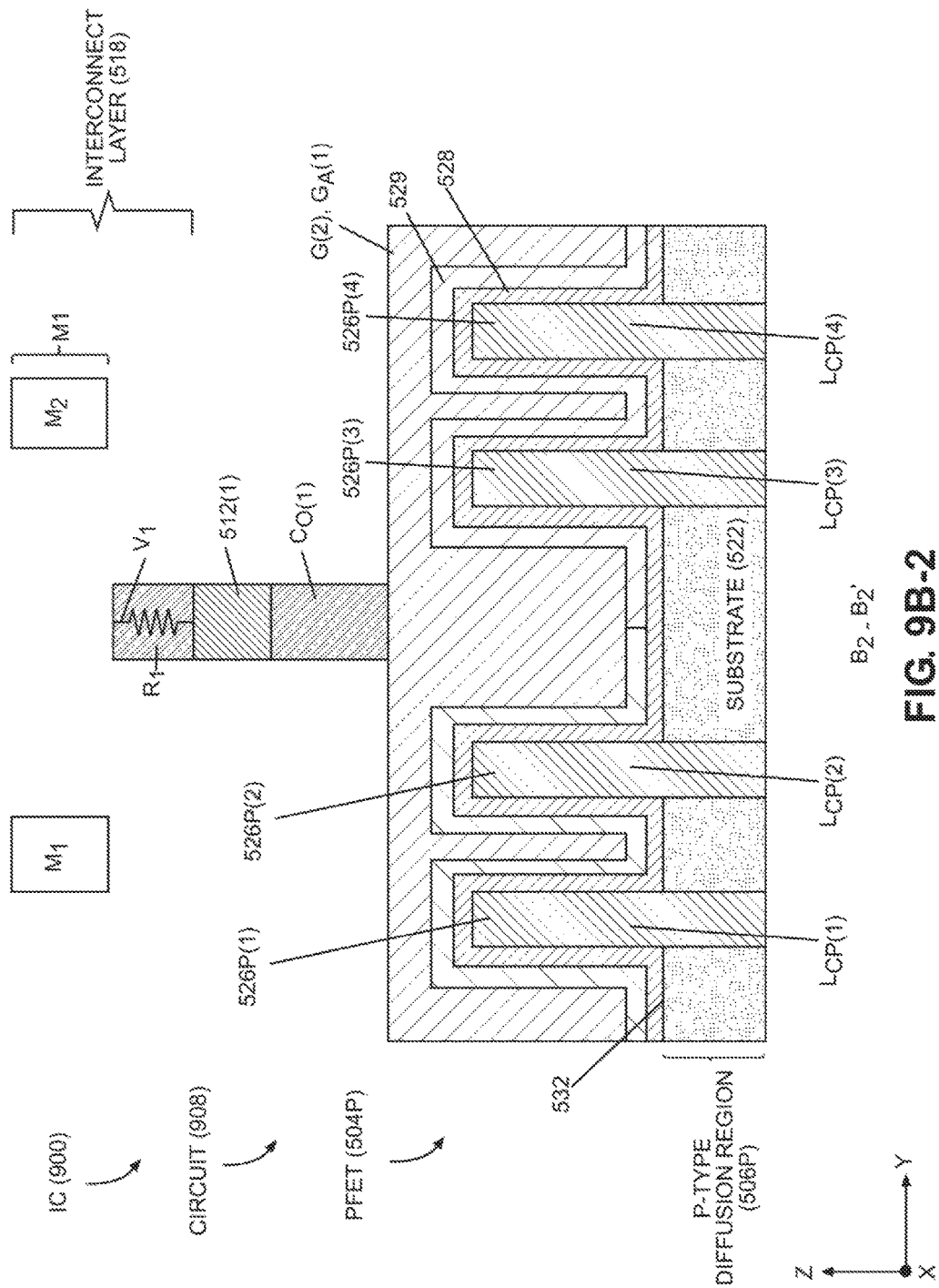
Figures 3, 9B:
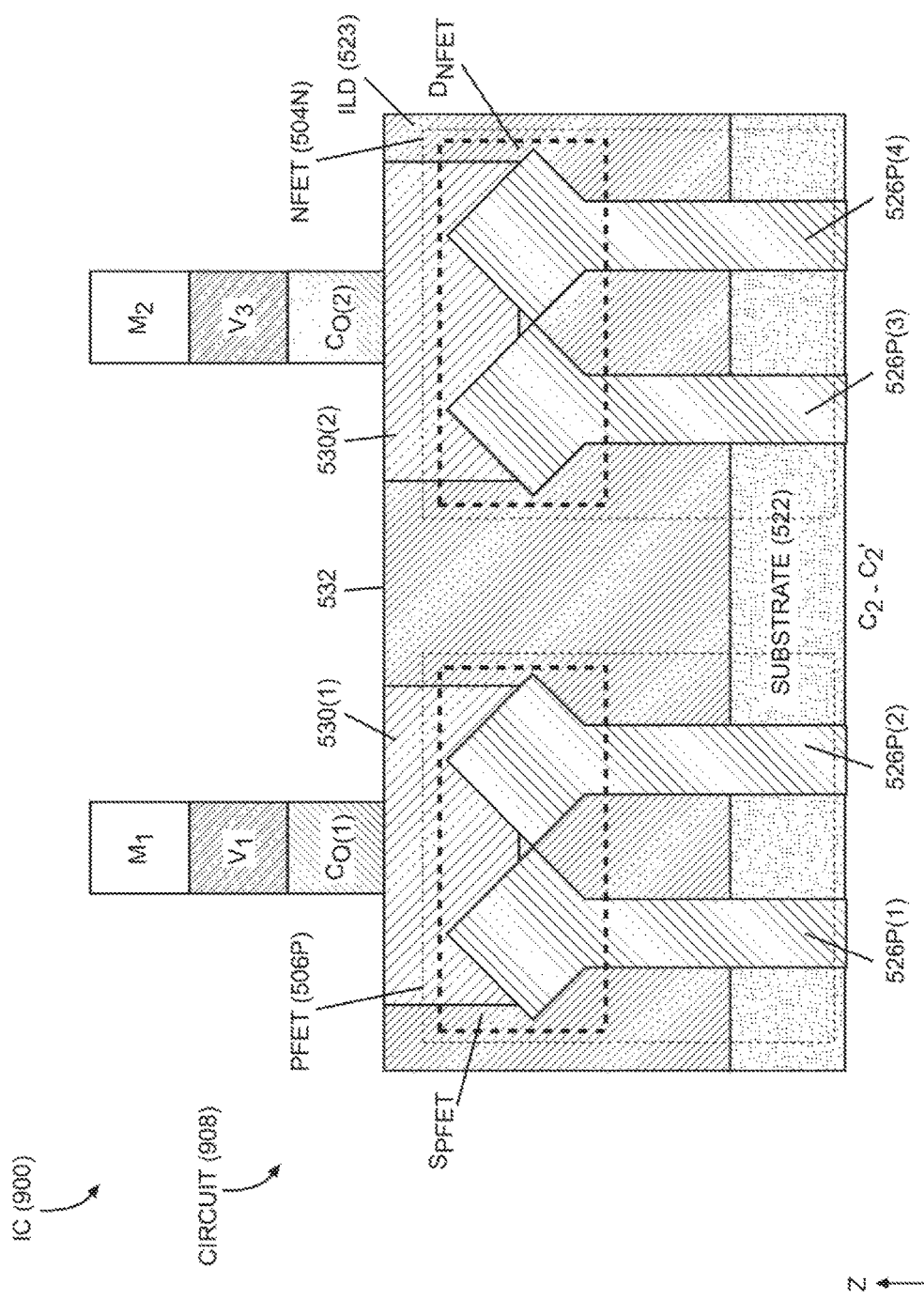

In this regard, FIGS. 9A-9B-3 illustrate an exemplary IC 900 that can be fabricated to employ additional vias coupled to a circuit output via to decrease circuit output resistance, and as a result reduce IR drop and decrease delay. The IC 900 may be fabricated in an IC chip. FIG. 9A is a top view of the IC 900 laid out according to an architecture of a circuit cell 902. FIGS. 9B-1-9B-3 are cross-sectional views taken in respective, cross-sections A2-A2', B2-B2', and C2-C2' of the IC 900 shown in FIG. 9A to further illustrate exemplary aspects of the IC 900. Common elements between the IC 900 in FIGS. 9A-9B-3 and the IC 500 in FIGS. 5A-5B-3 are shown with common element numbers in FIGS. 9A-9B-3 and thus will not be re-described.

As shown in FIG. 9A, the first output metal interconnect line 512(1) is in contact with and extends between the first output contact $C_{O(1)}$ connected to the PFET 504P in a first output contact area $CA_1$, and across an adjacent dummy gate $G_{D(1)}$ to a second output contact area $CA_2$ on the opposite side 514(2) of the dummy gate $G_{D(1)}$ from the side 514(1) of the dummy gate $G_{D(1)}$ adjacent to the signal output node 510. The second side 514(2) of the dummy gate $G_{D(1)}$ is adjacent to another, second dummy gate G(4), $G_{D(2)}$ spaced by the gate pitch $G_O$. A diffusion break is not included in the substrate 522 between the adjacent dummy gates $G_{D(1)}$, $G_{D(2)}$. The area in the substrate 522 between the adjacent dummy gates $G_{D(1)}$, $G_{D(2)}$ is in an active diffusion region. The P-type and N-type diffusion regions 506P, 506N extend between the adjacent dummy gates $G_{D(1)}$, $G_{D(2)}$. The second dummy gate $G_{D(2)}$ extends along the longitudinal axis $L_{G(4)}$ parallel to the longitudinal axis $L_{G(3)}$ of the first dummy gate $G_{D(1)}$. The second output contact area $CA_2$ is located above the top surface 532 of the substrate 522 between the adjacent dummy gates $G_{D(1)}$, $G_{D(2)}$ in the P-type diffusion region 506P. The second output contact area $CA_2$ provides space in the circuit 908 so that the first output metal interconnect line 512(1) can extend into second output contact area $CA_2$ for supporting the second output via $V_2$ without interfering with other structures in the IC 900. Note that as shown in FIG. 9B-1, an optional third output contact $C_{O(3)}$ could be formed between the adjacent dummy gates $G_{D(1)}$, $G_{D(2)}$ in the P-type diffusion region 506P and in contact with the first output metal interconnect line 512(1) if desired to further reduce resistance of the signal output node 510.

Further, in this example, the IC 900 is fabricated according to a CMOS cell architecture. Thus, as shown in FIG. 9A, the IC 900 also includes the NFET 504N in a second, N-type diffusion region 506N. Like the PFET 504P illustrated in FIG. 9B-1, to further reduce the output resistance of signal output node 510 of the circuit 908 in which the drain $D_{NFET}$ is also coupled, the second output metal interconnect line 512(2) is also formed in the IC 900. The second output metal interconnect line 512(2) is in contact with and extends between the second output contact $C_{O(2)}$ connected to the NFET 504N in a third output contact area $CA_3$, and the fourth output contact area $CA_4$. A third output via $V_3$ is in contact to the first output metal interconnect line 512(2) to provide interconnectivity between the second output contact $C_{O(2)}$ connected to the NFET 504N and a second metal line $M_2$ in the interconnect layer 518 in the IC 500, such as metal one layer M1. A fourth output via $V_4$ is also connected to the second output metal interconnect line 512(2) in the fourth output contact area $CA_4$. The fourth output contact area $CA_4$ is located above the top surface 532 of the substrate 522 between the adjacent dummy gates $G_{D(1)}$, $G_{D(2)}$ in the N-type diffusion region 506N. The fourth output contact area $CA_4$ provides space in the circuit 908 so that the second output metal interconnect line 512(2) can extend into fourth output contact area $CA_4$ for supporting the fourth output via $V_4$ without interfering with other structures in the IC 900. Note that as shown in FIG. 9A, an optional fourth output contact $C_{O(4)}$ could be formed between the adjacent dummy gates $G_{D(1)}$, $G_{D(2)}$ in the N-type diffusion region 506N and in contact with the first output metal interconnect line 512(1) if desired to further reduce resistance of the signal output node 510.

As shown in FIGS. 9B-2 and 9B-3, P-type semiconductor channel structures 526P(1)-526P(4) in the form of "Fins" are formed in the circuit 908 above the substrate 522 and extended along longitudinal axes $L_{C(N)}$, $L_{C(P)}$ in the X-axis direction, such that the PFET 504P and NFET 504N are respective P-type FinFET and N-type FinFET. Note that although not shown in FIGS. 9B-2 and 9B-3, the N-type diffusion region 506N in the circuit 908 in FIG. 9A also includes similar semiconductor channel structures to the P-type semiconductor channel structures 526P(1)-526P(4).

Figure 10:
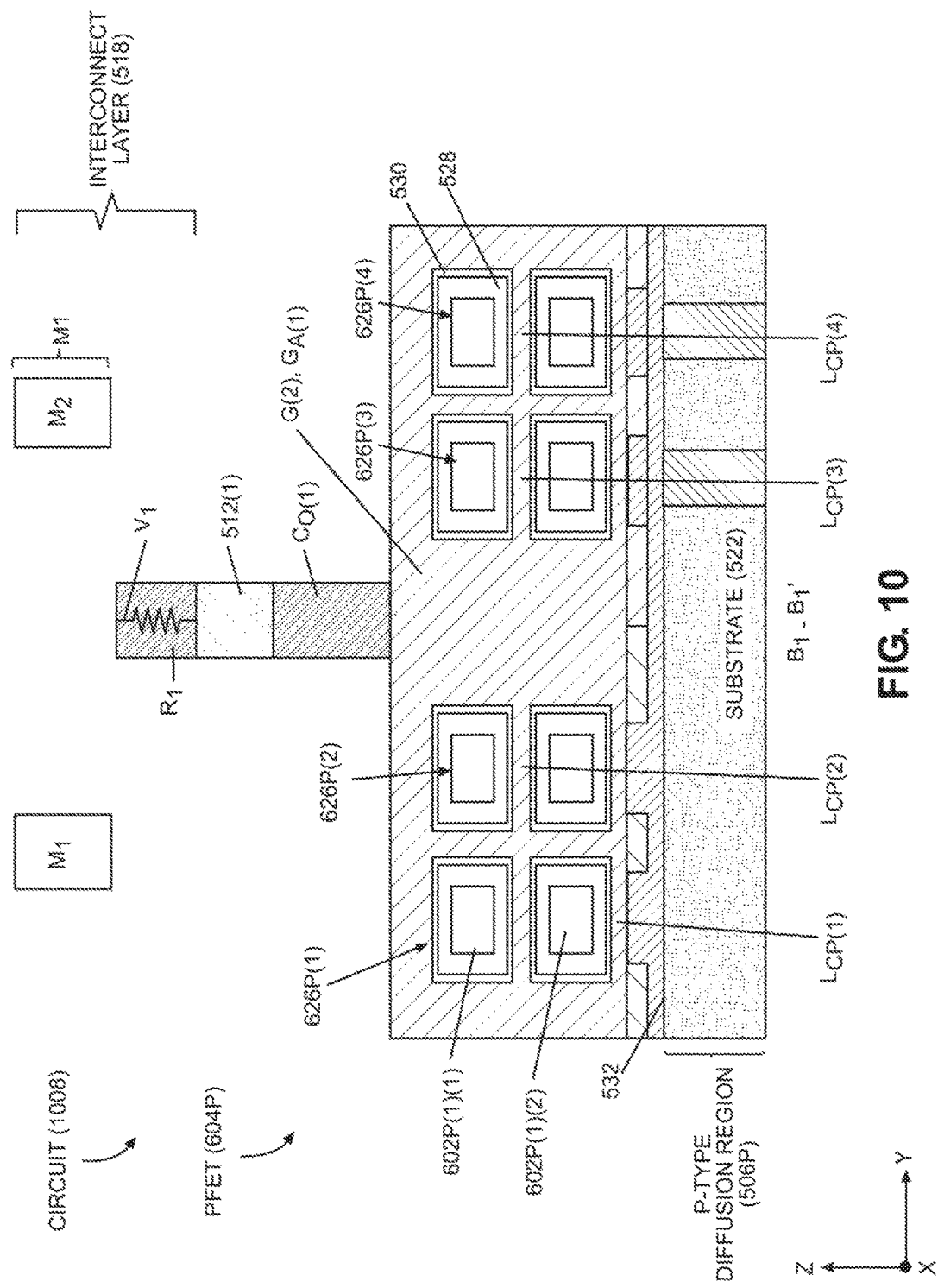
FIG. 10 an alternative cross-sectional view of the cross-sectional view of the IC in FIG. 9B-2, with the FETs of the circuit formed in the IC in FIG. 9A as a gate-all-around (GAA) FET(s) and to illustrate the output vias coupled to the output metal interconnect.

The PFET 504P and NFET 504N formed in the circuit 908 in FIGS. 9A-9B-3 are FinFETs. However, the PFET 504P and NFET 504N are not limited to FinFETs. For example, the PFET 504P and NFET 504N could be fabricated in the IC 900 as a gate-all-around (GAA) FET or planar FET, as examples, to form a circuit. In this regard, FIG. 6 illustrates a PFET 604P in the form of a GAA FET that can be formed on the IC 900 in FIG. 9A in lieu of the PFET 504P. FIG. 10 is an alternative view of the IC 900 in FIG. 9A across the cross-sectional line $B_2$-$B_2$' to form a circuit 1008. Common structures between the GAA PFET 604P in FIG. 6 and the GAA PFET 604P in FIG. 10 are shown with common element numbers and thus will not be re-described. As shown in FIG. 10, the PFET 604P includes semiconductor channel structures 626P(1)-626P(4) in the form of gate-all-around semiconductor structures. Each semiconductor channel structures 626P(1)-626P(4) includes respective nanostructures 602P(1)(1)-602P(4)(2) (e.g., nanowire, nanoslabs) each surrounded by the work metal function layer 528 and dielectric layer 529 and the gate material of the gate G(2). The gate material of the gate G(2) surrounds the nanostructures 602P(1)(1)-602P(4)(2).

Figure 11:
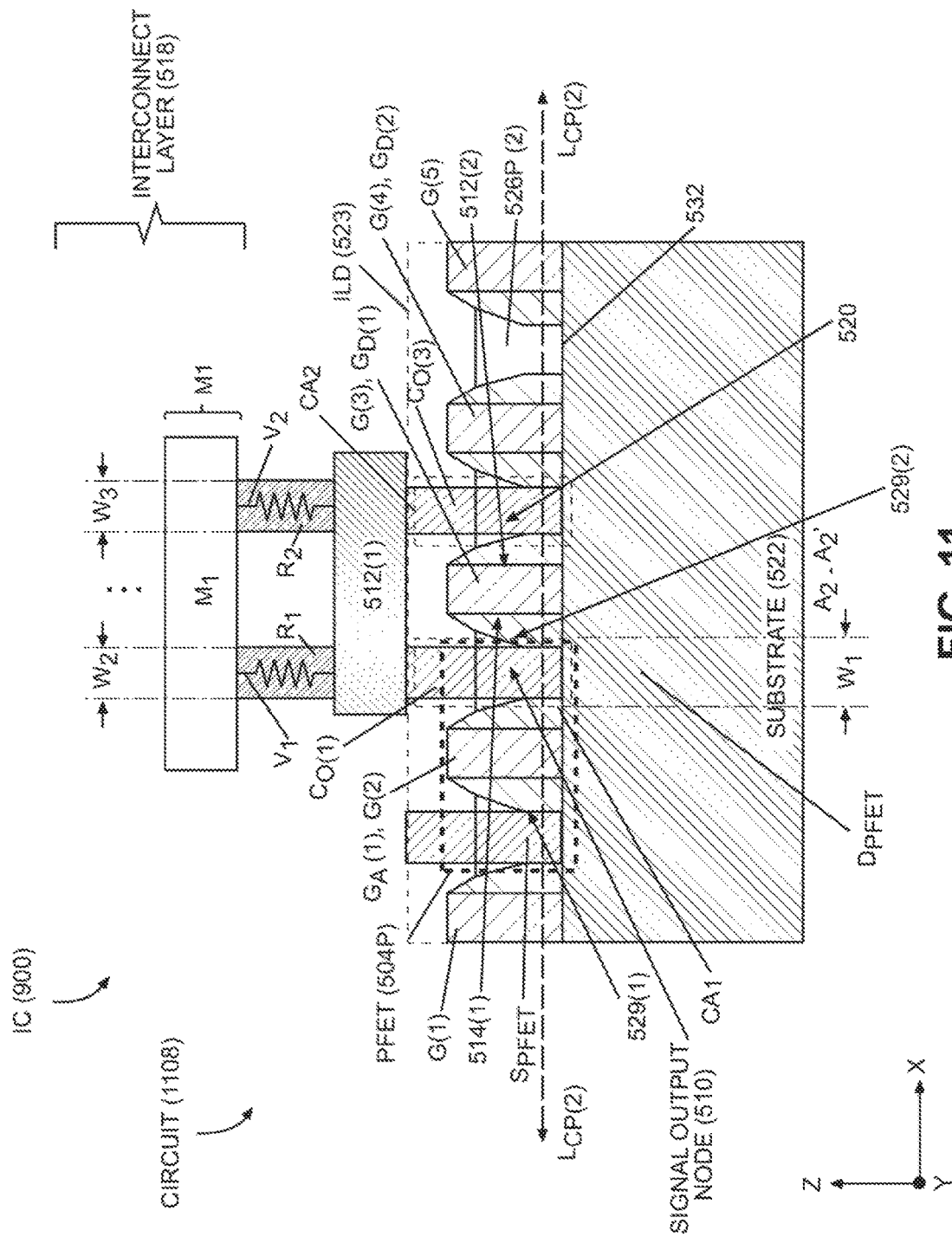
FIG. 11 an alternative cross-sectional view of the cross-sectional view of the IC in FIG. 9B-1, with the FETs of the circuit formed in the IC in FIG. 9A as planar FETs and to illustrate the second output via coupled to the output metal interconnect extending between the first output contact connected to the signal output node of planar FET(s) in FIG. 5A and the second output contact area.

The PFET 504P and NFET 504N in the circuit 908 in FIGS. 9A-9B-3 could also be fabricated in the IC 900 as planar FET as another example to form a circuit 1108 as shown in FIG. 11. In this regard, FIG. 11 illustrates the PFET 704P in the form of a planar FET that can be formed on the IC 900 in FIG. 9A in lieu of the PFET 504P. FIG. 11 is an alternative view of the IC 500 in FIG. 5A across the cross-sectional line $A_2$-$A_2$'. Common structures between the planar PFET 704P in FIG. 7 and the GAA PFET 604P in FIG. 11 are shown with common element numbers and thus will not be re-described. As shown in FIG. 11, a source $S_{PFET}$ and drain $D_{PFET}$ of the PFET 704P is formed in the substrate 522 below the top surface 532 of the substrate 522. The semiconductor channel structure 726P is formed in the substrate 522 between the source $S_{PFET}$ and drain $D_{PFET}$ the PFET 704P. The active gate $G_{A(1)}$ is disposed above the semiconductor channel structure 726P. The optional third output contact $C_{O(3)}$ is shown formed between the adjacent dummy gates $G_{D(1)}$, $G_{D(2)}$ in the P-type diffusion region 506P and in contact with the first output metal interconnect line 512(1) if desired to further reduce resistance of the signal output node 510.

In another exemplary aspect, an IC is provided. The IC comprises a substrate. The substrate may include the substrate 522 in the IC 500 in FIGS. 5A-7 and the IC 900 in FIGS. 9A-1 as a non-limiting example. The IC also comprises a means for providing a diffusion disposed in the substrate, the means for providing the diffusion comprising a means for providing a semiconducting channel. Examples of the means for providing a diffusion disposed in the substrate, the means for providing the diffusion comprising a means for providing a semiconducting channel can include, without limitation, the P-type diffusion region 506P and/or the N-type diffusion region 506N in the ICs 500, 900 in FIGS. 5A-7 and 9A-11. The IC also comprises a means for providing isolation extending above the means for providing the diffusion. Examples of the means for providing isolation extending above the means for providing the diffusion may can include, without limitation, the dummy gate $G_{D(1)}$ in the ICs 500, 900 in FIGS. 5A-7 and 9A-11. The IC also comprises a means for providing a conduction path disposed above the means for providing the diffusion, the means for providing the conduction path adjacent to a first side of the means for providing isolation. Examples of the means for providing a conduction path can include, without limitation, the active gate $G_{A(1)}$ in the ICs 500, 900 in FIGS. 5A-7 and 9A-11. The IC also comprises a circuit that comprises a FET in the means for providing a diffusion. Examples of the FET include, without limitation, the PFETs 504P, 604P, 704P in FIGS. 5A-7 and 9A-11, and the NFETs 504N, 604N, 704N in FIGS. 5A-7 and 9A-11. The IC also comprises a signal output node connected to at least one of the source and the drain of the FET. An example of the signal output node includes, without limitation, the signal output node 510 in the ICs 500, 900 in FIGS. 5A-7 and 9A-11. The IC also comprises a means for providing an output contact disposed in a first output contact area above the signal output node and in contact with the signal output node. Examples of the means for providing an output contact include, without limitation, the output contacts $C_{O(1)}$-$C_{O(4)}$ in the ICs 500, 900 in FIGS. 5A-7 and 9A-11. The IC also comprises a means for interconnecting the means for providing interconnection to the means for providing an output contact and disposed above the means for providing the output contact extending to a second output contact area outside the first output contact area, the second output contact area adjacent to a second side of the means for providing isolation opposite the first side of the means for providing isolation. Examples of the means for interconnecting include, without limitation, the first and second output metal interconnect line 512(1), 512(2) in the ICs 500, 900 in FIGS. 5A-7 and 9A-11. The IC also comprises a first means for providing a first vertical interconnect disposed above and in contact with the means for interconnecting the means for providing interconnection to the means for providing the output contact in the first output contact area. Examples of the first means for providing a first vertical interconnect include, without limitation, the vias $V_1$, $V_3$ in the ICs 500, 900 in FIGS. 5A-7 and 9A-11. The IC also comprises a second means for providing a second vertical interconnect disposed above and in contact with the means for interconnecting the means for providing interconnection to the means for providing the output contact in the second output contact area. Examples of the second means for providing a second vertical interconnect include, without limitation, the vias $V_2$, $V_4$ in the ICs 500, 900 in FIGS. 5A-7 and 9A-11.

An IC that includes an output metal interconnect connected to a first output contact connected to a signal output node of a circuit and a first output via in a first output contact area, wherein the output metal interconnect extends into a second output contact area outside the first output contact area contacting a second output via reducing the overall output via resistance of the circuit, including but not limited to the ICs 500, 900 in FIGS. 5A-7 and 9A-11, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
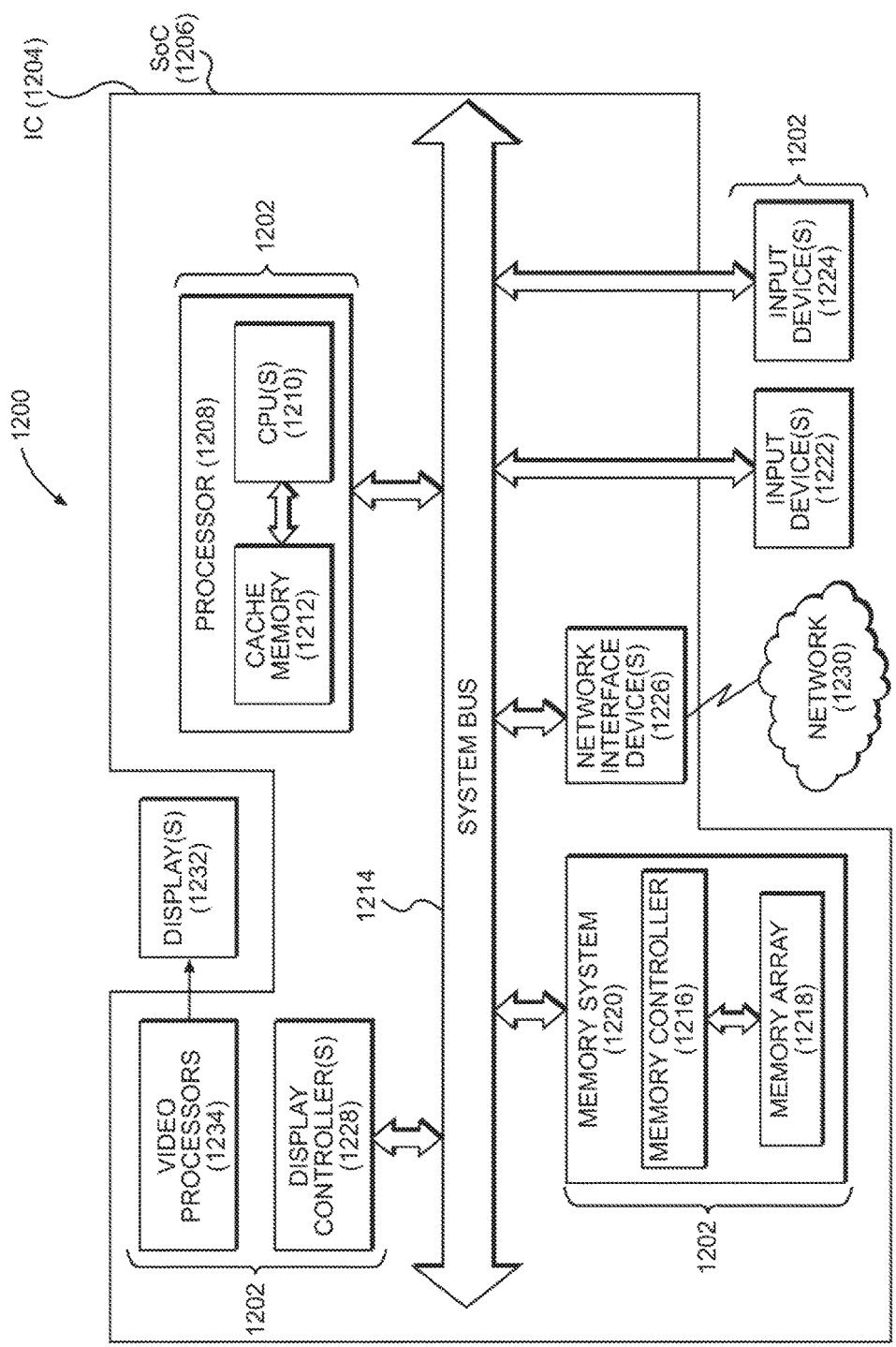
FIG. 12 is a block diagram of an exemplary processor-based system that can include an IC that includes an output metal interconnect connected to a first output contact connected to a signal output node of a circuit and a first output via in a first contact area, wherein the output metal interconnect extends into a second contact area outside the first contact area contacting a second output via to reduce the overall output via resistance of the circuit, including but not limited to the ICs 500, 900 in FIGS. 5A-7 and 9A-11.

In this regard, FIG. 12 illustrates an example of a processor-based system 1200 that can include an IC 1202 that includes an output metal interconnect connected to a first output contact connected to a signal output node of a circuit and a first output via in a first output contact area, wherein the output metal interconnect extends into a second output contact area outside the first output contact area contacting a second output via reducing the overall output via resistance of the circuit, including but not limited to the ICs 500, 900 in FIGS. 5A-7 and 9A-11, and according to any aspects disclosed herein. In this example, the processor-based system 1200 may be formed as an IC 1204 in a system-on-a-chip (SoC) 1206. The processor-based system 1200 includes a processor 1208 that includes one or more central processor units (CPUs) 1210, which may also be referred to as CPU or processor cores. The processor 1208 may have cache memory 1212 coupled to the processor(s) 1208 for rapid access to temporarily stored data. As an example, the cache memory 1212 could include an IC 1202 that include an output metal interconnect connected to a first output contact connected to a signal output node of a circuit and a first output via in a first output contact area, wherein the output metal interconnect extends into a second output contact area outside the first output contact area contacting a second output via reducing the overall output via resistance of the circuit, including but not limited to the ICs 500, 900 in FIGS. 5A-7 and 9A-11, and according to any aspects disclosed herein. The processor 1208 is coupled to a system bus 1214 and can intercouple master and slave devices included in the processor-based system 1200. As is well known, the processor 1208 communicates with these other devices by exchanging address, control, and data information over the system bus 1214. For example, the processor 1208 can communicate bus transaction requests to a memory controller 1216 as an example of a slave device. Although not illustrated in FIG. 12, multiple system buses 1214 could be provided, wherein each system bus 1214 constitutes a different fabric.

Other master and slave devices can be connected to the system bus 1214. As illustrated in FIG. 12, these devices can include a memory system 1220 that includes the memory controller 1216 and a memory array(s) 1218, one or more input devices 1222, one or more output devices 1224, one or more network interface devices 1226, and one or more display controllers 1228, as examples. Each of the memory system 1220, the one or more input devices 1222, the one or more output devices 1224, the one or more network interface devices 1226, and the one or more display controllers 1228 can include an IC 1202 that include an output metal interconnect connected to a first output contact connected to a signal output node of a circuit and a first output via in a first output contact area, wherein the output metal interconnect extends into a second output contact area outside the first output contact area contacting a second output via reducing the overall output via resistance of the circuit, including but not limited to the ICs 500, 900 in FIGS. 5A-7 and 9A-11, and according to any aspects disclosed herein. The input device(s) 1222 can include any type of input device, including, but not limited to, input keys, switches, voice processors, etc. The output device(s) 1224 can include any type of output device, including, but not limited to, audio, video, other visual indicators, etc. The network interface device(s) 1226 can be any device configured to allow exchange of data to and from a network 1230. The network 1230 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1226 can be configured to support any type of communications protocol desired.

The processor 1208 may also be configured to access the display controller(s) 1228 over the system bus 1214 to control information sent to one or more displays 1232. The display controller(s) 1228 sends information to the display(s) 1232 to be displayed via one or more video processors 1234, which process the information to be displayed into a format suitable for the display(s) 1232. The display(s) 1232 can include any type of display, including, but not limited to, a cathode ray tube (CRT), a liquid crystal display (LCD), a plasma display, a light emitting diode (LED) display, etc. The display controller(s) 1228, display(s) 1232, and/or the video processor(s) 1234 can include an IC 900 that includes an output metal interconnect connected to a first output contact connected to a signal output node of a circuit and a first output via in a first output contact area, wherein the output metal interconnect extends into a second output contact area outside the first output contact area contacting a second output via reducing the overall output via resistance of the circuit, including but not limited to the ICs 500, 900 in FIGS. 5A-7 and 9A-11, and according to any aspects disclosed herein.

Figure 13:
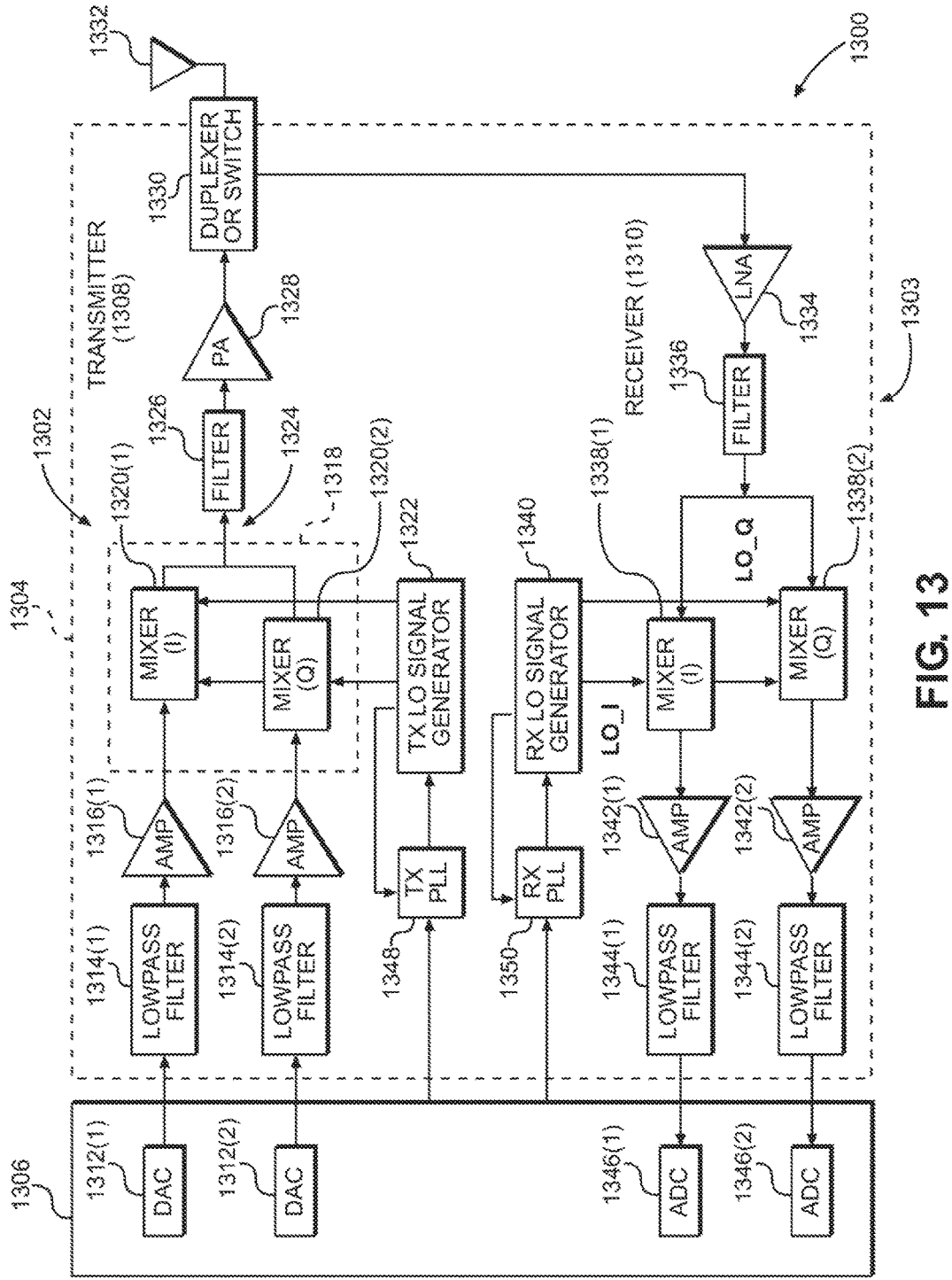
FIG. 13 is a block diagram of an exemplary wireless communications device that includes radio frequency (RF) components formed from an IC, wherein any of the components in the IC can include an output metal interconnect connected to a first output contact connected to a signal output node of a circuit and a first output via in a first contact area, wherein the output metal interconnect extends into a second contact area outside the first contact area contacting a second output via to reduce the overall output via resistance of the circuit, including but not limited to the ICs 500, 900 in FIGS. 5A-7 and 9A-11.

FIG. 13 illustrates an exemplary wireless communications device 1300 that includes radio frequency (RF) components formed from an IC 1302 that include an output metal interconnect connected to a first output contact connected to a signal output node of a circuit and a first output via in a first output contact area, wherein the output metal interconnect extends into a second output contact area outside the first output contact area contacting a second output via reducing the overall output via resistance of the circuit, including but not limited to the ICs 500, 900 in FIGS. 5A-7 and 9A-11, and according to any aspects disclosed herein. The wireless communications device 1300 may include or be provided in any of the above referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RF ICs (RFICs), mixed-signal ICs, etc.

The transmitter 1308 or the receiver 1310 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312 (2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMP) 1316(1), 1316(2) amplify the signals from the lowpass filters 1314(1), 1314 (2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Down-conversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by amplifiers (AMP) 1342(1), 1342(2) and further filtered by lowpass filters 1344(1), 1344(2) to obtain I and Q analog input signals, which are provided to the data processor 1306. In this example, the data processor 1306 includes ADCs 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC), comprising:
   a substrate;
   a diffusion region disposed in the substrate, the diffusion region comprising a semiconductor channel each having a first longitudinal axis in a first direction;
   a dummy gate extending along a second longitudinal axis orthogonal to the first longitudinal axis, the first dummy gate disposed above the diffusion region;
   a conducting gate extending along a third longitudinal axis orthogonal to the first longitudinal axis, the conducting gate disposed above the diffusion region and adjacent to a first side of the dummy gate by a gate pitch;
   a circuit comprising:
      a Field-Effect Transistor (FET) in the diffusion region, the FET comprising:
         a semiconductor channel structure in the diffusion region;
         a first gate comprising a first active gate in a portion of the conducting gate disposed above the semiconductor channel structure;
         a source in a first end portion of the semiconductor channel structure; and
         a drain in a second end portion of the semiconductor channel structure; and
      a signal output node connected to at least one of the source and the drain of the FET;
      an output contact disposed in a first output contact area above the signal output node and in contact with the signal output node;
      an output metal interconnect line disposed above the output contact and in contact with the output contact and extending to a second output contact area outside the first output contact area, the second output contact area adjacent to a second side of the dummy gate opposite of the first side of the dummy gate;
      a first via disposed above and in contact with the output metal interconnect line in the first output contact area; and
      a second via disposed above and in contact with the output metal interconnect line in the second output contact area.

2. The IC of claim 1, further comprising a diffusion break in the diffusion region below the second output contact area, the diffusion break comprising the dummy gate, wherein the diffusion break extends from a top surface of the substrate to a first depth into the substrate.

3. The IC of claim 2, wherein the diffusion break comprises a double diffusion break (DDB) comprising the dummy gate and a trench isolation structure adjacent to the second side of the dummy gate and extending from the top surface of the substrate to a second depth into the substrate.

4. The IC of claim 1, further comprising a white space comprising an interlayer dielectric (ILD) between a top surface of the substrate in the second output contact area and the output metal interconnect line in the second output contact area.

5. The IC of claim 1, wherein the second output contact area between a top surface of the substrate in the second output contact area and the output metal interconnect line does not include a conducting structure or a semi-conducting structure.

6. The IC of claim 1, further comprising:
   a second dummy gate extending along a fourth longitudinal axis parallel to the second longitudinal axis, the second dummy gate disposed above the diffusion region and adjacent to the second side of the first dummy gate by the gate pitch, the second dummy gate having a first side adjacent to the second side of the first dummy gate;
   wherein:
      the second output contact area is disposed between the second side of the dummy gate and a first side of the second dummy gate.

7. The IC of claim 6, further comprising a second contact disposed in the second output contact area above the diffusion region, the second contact in contact with the output metal interconnect line.

8. The IC of claim 7, further not comprising a trench isolation structure in the diffusion region between the first dummy gate and the second dummy gate.

9. The IC of claim 1, further comprising:
   a second diffusion region disposed in the substrate, the second diffusion region comprising a second semiconductor channel having a fourth longitudinal axis parallel to the first longitudinal axis;
   a non-diffusion region between the diffusion region and the second diffusion region; and
   wherein:
      the diffusion region comprises a P-type diffusion region;
      the second diffusion region comprises an N-type diffusion region; and the semiconductor channel comprises a P-type semiconductor channel structure;
the second semiconductor channel comprises an N-type semiconductor channel structure;
the dummy gate further extends along the second longitudinal axis above the N-type diffusion region; and
the conducting gate further extends along the third longitudinal axis above the N-type diffusion region.

10. The IC of claim 9, further comprising:
a second FET in the N-type diffusion region, the second FET comprising:
a second semiconductor channel structure in the N-type diffusion region;
a second gate comprising a second active gate in a portion of the conducting gate disposed above the semiconductor channel;
a second source in a first end portion of the second semiconductor channel structure;
a second drain in a second end portion of the second semiconductor channel structure; and
a second signal output node connected to at least one of the second source and the second drain of the second FET; and
a second output metal interconnect line connecting the first signal output node to the second signal output node.

11. The IC of claim 1, wherein the FET comprises a first FinFET, wherein:
the semiconductor channel extends above a top surface of the substrate; and
the active gate is disposed around at least a portion of the semiconductor channel.

12. The IC of claim 1, wherein the FET comprises a gate-all-around (GAA) FET, wherein:
the semiconductor channel extends above a top surface of the substrate; and
the active gate is disposed completely around the semiconductor channel.

13. The IC of claim 1, wherein the FET comprises a first planar FET, wherein:
the semiconductor channel is disposed in the substrate below a top surface of the substrate; and
the active gate is disposed above the top surface of the substrate above the first semiconductor channel.

14. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A integrated circuit (IC), comprising:
a substrate;
a means for providing a diffusion disposed in the substrate, the means for providing the diffusion comprising a means for providing a semiconducting channel;
a means for providing isolation extending above the means for providing the diffusion;
a means for providing a conduction path disposed above the means for providing the diffusion, the means for providing the conduction path adjacent to a first side of the means for providing isolation;
a circuit comprising:
a Field-Effect Transistor (FET) in the means for providing the diffusion, the FET comprising:
a semiconductor channel structure in the means for providing the diffusion;
a first gate comprising a first active gate in a portion of the means for providing a conduction path disposed above the semiconductor channel structure;
a source in a first end portion of the semiconductor channel structure; and
a drain in a second end portion of the semiconductor channel structure; and
a signal output node connected to at least one of the source and the drain of the FET;
a means for providing an output contact disposed in a first output contact area above the signal output node and in contact with the signal output node;
a means for interconnecting the means for providing interconnection to the means for providing an output contact disposed above the output contact extending to a second output contact area outside the first output contact area, the second output contact area adjacent to a second side of the means for providing isolation opposite of the first side of the means for providing isolation;
a first means for providing a first vertical interconnect disposed above and in contact with the means for interconnecting the means for providing interconnection to the means for providing the output contact in the first output contact area; and
a second means for providing a second vertical interconnect disposed above and in contact with the means for interconnecting the means for providing interconnection to the means for providing the output contact in the second output contact area.

16. A method of fabricating an integrated circuit (IC), comprising:
forming a substrate;
forming a diffusion region in the substrate comprising a semiconductor channel having a first longitudinal axis in a first direction;
forming a dummy gate above the diffusion region and extending along a second longitudinal axis orthogonal to the first longitudinal axis
forming a conducting gate above the diffusion region and adjacent to a first side of the dummy gate by a gate pitch and extending along a third longitudinal axis orthogonal to the first longitudinal axis;
forming a circuit comprising:
a Field-Effect Transistor (FET) in the diffusion region, the FET comprising:
a semiconductor channel structure in the diffusion region;
a first gate comprising a first active gate in a portion of the conducting gate disposed above the semiconductor channel structure;
a source in a first end portion of the semiconductor channel structure; and
a drain in a second end portion of the semiconductor channel structure; and
forming a signal output node connected to at least one of the source and the drain of the FET;

forming an output contact disposed in a first output contact area above the signal output node and in contact with the signal output node;

forming an output metal interconnect line disposed above the output contact and in contact with the output contact and extending to a second output contact area outside the first output contact area, the second output contact area adjacent to a second side of the dummy gate opposite of the first side of the dummy gate;

forming a first via disposed above and in contact with the output metal interconnect line in the first output contact area; and forming a second via disposed above and in contact with the output metal interconnect line in the second output contact area.

17. The method of claim 16, wherein forming the dummy gate further comprises forming the dummy gate to a first depth into the substrate below a top surface of the substrate to form a diffusion break in the diffusion region below the second output contact area.

18. The method of claim 17, further comprising forming a trench isolation structure adjacent to the second side of the dummy gate to a second depth into the substrate below the top surface of the substrate.

19. The method of claim 16, further not forming a conducting structure or a semi-conducting structure in the second output contact area between a top surface of the substrate in the second output contact area and the output metal interconnect line.

20. The method of claim 16, further comprising:
forming a second dummy gate disposed above the diffusion region and adjacent to the second side of the first dummy gate by the gate pitch and extending along a fourth longitudinal axis parallel to the second longitudinal axis;
wherein:
the second output contact area is disposed between the second side of the dummy gate and a first side of the second dummy gate.

21. The method of claim 20, further comprising forming a second contact disposed in the second output contact area above the diffusion region, the second contact in contact with the output metal interconnect line.

22. The method of claim 20, further not comprising not forming a trench isolation structure in the diffusion region between the first dummy gate and the second dummy gate.

23. The method of claim 16, further comprising:
forming a second diffusion region in the substrate comprising a semiconductor channel having a fourth longitudinal axis parallel to the first longitudinal axis;
forming a non-diffusion region between the diffusion region and the second diffusion region; and
wherein:
the diffusion region comprises a P-type diffusion region;
the second diffusion region comprises an N-type diffusion region; and
the semiconductor channel comprises a P-type semiconductor channel structure;
the second semiconductor channel comprises an N-type semiconductor channel structure;
the dummy gate further extends along the second longitudinal axis above the N-type diffusion region; and
the conducting gate further extends along the third longitudinal axis above the N-type diffusion region.

24. The method of claim 23, further comprising:
forming a second FET in the N-type diffusion region, the second FET comprising:
a second semiconductor channel structure in the N-type diffusion region;
a second gate comprising a second active gate in a portion of the conducting gate disposed above the semiconductor channel;
a second source in a first end portion of the second semiconductor channel structure; and
a second drain in a second end portion of the second semiconductor channel structure; and
a second signal output node connected to at least one of the second source and the second drain of the second FET; and
forming a second output metal interconnect line connecting the first signal output node to the second signal output node.

* * * * *